US010741766B2

(12) United States Patent
Chung et al.

(10) Patent No.: US 10,741,766 B2
(45) Date of Patent: Aug. 11, 2020

(54) ORGANIC SEMICONDUCTOR THIN FILM AND METHOD OF MANUFACTURING THE SAME AND THIN FILM TRANSISTOR AND ELECTRONIC DEVICE

(71) Applicants: Samsung Electronics Co., Ltd., Suwon-si, Gyeonggi-do (KR); The Board of Trustees of the Leland Stanford Jr. University, Stanford, CA (US)

(72) Inventors: Jong Won Chung, Hwaseong-si (KR); Sangyoon Lee, Seoul (KR); Zhenan Bao, Stanford, CA (US); Jie Xu, Stanford, CA (US)

(73) Assignees: Samsung Electronics Co., Ltd., Gyeonggi-do (KR); The Board of Trustees of the Leland Junior University, Stanford, CA (US)

( * ) Notice: Subject to any disclaimer, the term of this patent is extended or adjusted under 35 U.S.C. 154(b) by 395 days.

(21) Appl. No.: 15/497,829

(22) Filed: Apr. 26, 2017

(65) Prior Publication Data
US 2017/0331045 A1 Nov. 16, 2017

Related U.S. Application Data

(60) Provisional application No. 62/335,250, filed on May 12, 2016.

(51) Int. Cl.
*H01L 51/00* (2006.01)
*C08L 53/00* (2006.01)
(Continued)

(52) U.S. Cl.
CPC .......... *H01L 51/0036* (2013.01); *C08L 53/00* (2013.01); *C08L 53/025* (2013.01);
(Continued)

(58) Field of Classification Search
None
See application file for complete search history.

(56) References Cited

U.S. PATENT DOCUMENTS 7,351,606 B2    4/2008  Arias
8,828,793 B2    9/2014  Cho et al.
(Continued)

FOREIGN PATENT DOCUMENTS

KR    10-2012-0060428 A    6/2012

OTHER PUBLICATIONS

Savagatrup, et al. "Best of Both Worlds: Conjugated Polymers Exhibiting Good Photovoltaic Behavior and High Tensile Elasticity," Macromolecules, American Chemical Society, vol. 47, pp. 1981-1992 (2014).

(Continued)

*Primary Examiner* — Katie L. Hammer
(74) *Attorney, Agent, or Firm* — Harness, Dickey & Pierce, P.L.C.

(57) ABSTRACT

Disclosed are an organic semiconductor thin film, a manufacturing method thereof, and a thin film transistor and an electronic device including the organic semiconductor thin film. The organic semiconductor thin film includes a matrix. The matrix includes an elastomer and nanoconfined polymer structures embedded in the matrix. The nanoconfined polymer structures form a polymer network. The nanoconfined polymer structures include a conjugation semiconductor polymer. The conjugation semiconductor polymer includes a repeating unit having at least one conjugation system in its main chain. The nanoconfined polymer structures are present in an upper surface layer and a lower surface layer of the organic semiconductor thin film respectively.

20 Claims, 46 Drawing Sheets

(51) Int. Cl.
C08L 65/00 (2006.01)
H01L 51/05 (2006.01)
C08L 53/02 (2006.01)

(52) U.S. Cl.
CPC .......... *C08L 65/00* (2013.01); *H01L 51/0043* (2013.01); *H01L 51/0566* (2013.01); *C08G 2261/124* (2013.01); *C08G 2261/146* (2013.01); *C08G 2261/1412* (2013.01); *C08G 2261/3223* (2013.01); *C08G 2261/3225* (2013.01); *C08G 2261/3243* (2013.01); *C08G 2261/3246* (2013.01); *C08G 2261/3327* (2013.01); *C08G 2261/344* (2013.01); *C08G 2261/51* (2013.01); *C08G 2261/92* (2013.01); *C08L 2203/20* (2013.01); *C08L 2205/16* (2013.01); *H01L 51/0007* (2013.01); *H01L 51/0053* (2013.01); *H01L 51/0545* (2013.01)

(56) References Cited

U.S. PATENT DOCUMENTS

| | | | |
|---|---|---|---|
| 2009/0302311 A1* | 12/2009 | Turbiez | B82Y 10/00 257/40 |
| 2012/0018708 A1* | 1/2012 | Cho | H01L 51/0036 257/40 |
| 2014/0131685 A1 | 5/2014 | Im et al. | |
| 2016/0013411 A1 | 1/2016 | Lim et al. | |

OTHER PUBLICATIONS

Choi, et al. "Biaxially Stretchable "Wavy"Silicon Nanomembranes", Nano Letters, vol. 7, No. 6, pp. 1655-1663 (2007).

Sekitani, et al. "Stretchable active-matrix organic light-emitting diode display using printable elastic conductors," Nature Materials, vol. 8 pp. 494-499 (2009).

Kim, et al. "Large-scale pattern growth of graphene films for stretchable transparent electrodes," Nature Letters, vol. 457, pp. 706-710 (2009).

Benight, et al. "Stretchable and self-healing polymers and devices for electronic skin," Progress in Polymer Science, vol. 38, pp. 1961-1977 (2013).

Rogers, et al. "Materials and Mechanics for Stretchable Electronics," Science, vol. 327, pp. 1603-1607 (2010).

Sekitani, et al. "A rubberlike Stretchable Action Matrix Using Elastic Conductors," Science, vol. 321, pp. 1468-1472 (2008).

O'Connor, et al. "Anisotropic Structure and Charge Transport in Highly Strain-Aligned Regioregular Poly(3-hexylthiophene)" Advanced Functional Materials, vol. 21, pp. 3697-3705 (2011).

Lipomi, et al. "Stretchable Organic Solar Cells," Advanced Materials, vol. 23, pp. 1771-1775 (2011).

Hammock, et al. "25 Anniversary Article: The Evolution of Electronic Skin (E-Skin): A Brief History, Design Considerations, and Recent Progress," Advanced Materials, vol. 25, pp. 5997-6038 (2013).

Chortos, et al. "Highly Stretchable Transistors Using a Microcracked Organic Semiconductor," Advanced Materials, vol. 26, pp. 4253-4259 (2014).

Shin, et al. "Polythiophene Nanofibril Bundles Surface-Embedded in Elastomer: A Route to a Highly Stretchable Active Channel Layer," Advanced Materials, vol. 27, pp. 1255-1261 (2015).

Wu, et al. "A Rapid and Facile Soft Contact Lamination Method: Evaluation of Polymer Semiconductors for Stretchable Transistors," Chemistry of Materials, American Chemical Society, vol. 26, pp. 4544-4551 (2014).

Kang, et al. "Record High Hole Mobility in Polymer Semiconductor via Side-Chain Engineering," Journal of American Chemical Society, vol. 135, pp. 14896-14899 (2013).

* cited by examiner

ORGANIC SEMICONDUCTOR THIN FILM AND METHOD OF MANUFACTURING THE SAME AND THIN FILM TRANSISTOR AND ELECTRONIC DEVICE

CROSS-REFERENCE TO RELATED APPLICATION

This application claim the benefit of U.S. Provisional Application No. 62/335,250, filed May 12, 2016, in the US Patent and Trademark Office, the entire disclosure of which is incorporated herein by reference.

BACKGROUND

1. Field

An organic semiconductor thin film, a method of manufacturing the organic semiconductor thin film, a thin film transistor, and an electronic device including the thin film transistor are disclosed.

2. Description of Related Art

The recent development of portable and smart electronics has changed the way humans interact and communicate with electronic devices. For example, intimate contact between humans and electronic devices has continuously been improving, with anticipation that, in the near future, wearable electronic devices may act as a second skin for humans to interact and communicate with other humans and electronics for various applications. As a result, deformable electronic materials (e.g., polymer semiconductor materials) that can be stretched similarly to human skin and are able to endure various human motions is an expanding field that has attracted increasing attention. Thin-film field-effect transistors (TFTs) are basic elements of stretchable electronic devices, and polymer semiconductor materials are a component of stretchable transistors. Research has been done to develop a semiconductor material with enhanced stretchability. So far, however, in the case of the currently available technologies, a polymer film tends to be more easily broken and to show a decreased level of electrical properties under an increased level of strain. Thus, developing a material that may show enhanced mechanical properties (e.g., stretchability) together with relatively high electrical properties may be desirable.

SUMMARY

Example embodiments provide an organic semiconductor thin film satisfying electrical characteristic and stretchability simultaneously.

Example embodiments provide a composition for the organic semiconductor thin film.

Example embodiments provide a method of manufacturing the organic semiconductor thin film.

Example embodiments provide a thin film transistor including the organic semiconductor thin film.

Example embodiments provide an electronic device including the organic semiconductor thin film or the thin film transistor.

According to example embodiments, an organic semiconductor thin film includes a matrix including an elastomer and nanoconfined polymer structures embedded in the matrix. The nanoconfined polymer structures form a polymer network. The nanoconfined polymer structures include a conjugation semiconductor polymer. The conjugation semiconductor polymer includes a repeating unit having at least one conjugation system in its main chain. The nanoconfined polymer structures are present in an upper surface layer and a lower surface layer of the organic semiconductor thin film, respectively.

In example embodiments, the nanoconfined polymer structure may be a nanofibril having a continuous pathway.

In example embodiments, the nanofibril may have a diameter of less than or equal to about 50 nm.

In example embodiments, the nanoconfined polymer structures may include aggregations of the conjugation semiconductor polymer.

In example embodiments, the polymer network may include a web-like nanofibril semiconducting polymer.

In example embodiments, the nanoconfined polymer structures may be distributed in a different amount in a thickness direction of the organic semiconductor thin film, and the nanoconfined polymer structures may be mainly distributed in an upper surface layer and a lower surface layer of the organic semiconductor thin film.

In example embodiments, the elastomer and the conjugation semiconductor polymer may be phase separated.

In example embodiments, the conjugation semiconductor polymer and the elastomer may be included in a weight ratio of about 70:30 to about 5:95.

In example embodiments, the conjugation semiconductor polymer and the elastomer may be included in a weight ratio of about 50:50 to about 10:90.

In example embodiments, the elastomer may include an elastic rubber.

In example embodiments, the elastomer may include one of polybutadiene (PB), a styrene-butadiene copolymer (SB), a styrene-butadiene-styrene copolymer (SBS), a styrene-ethylene-butylene-styrene copolymer (SEBS), an ethylene propylene diene rubber (EPDR), an acrylic rubber, a polychloroprene rubber, polyurethane, a fluoro-rubber, a butyl rubber, a silicone rubber, and a combination thereof.

In example embodiments, the conjugation semiconductor polymer may include a donor-acceptor type polymer having an electron donating moiety and an electron accepting moiety.

In example embodiments, the conjugation system may include at least one moiety represented by one of Chemical Formulae 1-1 to 1-10.

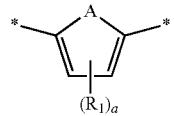

[Chemical Formula 1-1]

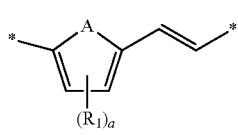

[Chemical Formula 1-2]

wherein, in Chemical Formula 1-1 or 1-2, A is O, S, Se, or NH, $R_1$ is a substituted or unsubstituted C1 to C40 aliphatic hydrocarbon group, a substituted or unsubstituted C6 to C30 aromatic hydrocarbon group, or a halogen, a is an integer ranging from 0 to 2 (or 1 to 2), and * is a linking point with an adjacent moiety,

[Chemical Formula 1-3]

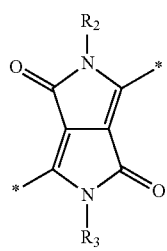

wherein, in Chemical Formula 1-3, $R_2$ and $R_3$ are independently hydrogen, a substituted or unsubstituted C1 to C40 aliphatic hydrocarbon group or a substituted or unsubstituted C6 to C30 aromatic hydrocarbon group, and * is a linking point with an adjacent moiety,

[Chemical Formula 1-4]

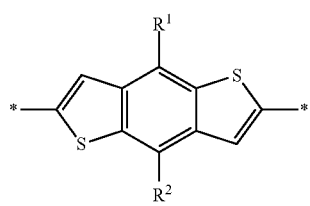

wherein, in Chemical Formula 1-4, $R^1$ and $R^2$ are independently hydrogen, a substituted or unsubstituted C1 to C40 aliphatic hydrocarbon group or a substituted or unsubstituted C6 to C30 aromatic hydrocarbon group, and * is a linking point with an adjacent moiety,

[Chemical Formula 1-5]

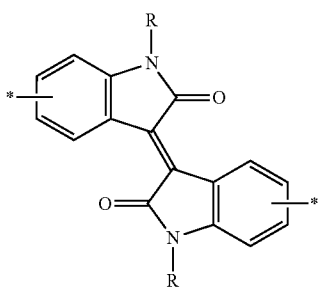

wherein, in Chemical Formula 1-5, R is independently hydrogen, a substituted or unsubstituted C1 to C40 aliphatic hydrocarbon group or a substituted or unsubstituted C6 to C30 aromatic hydrocarbon group, and * is a linking point with an adjacent moiety,

[Chemical Formula 1-6]

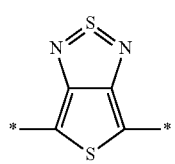

[Chemical Formula 1-7]

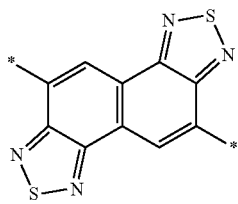

wherein, in Chemical Formula 1-6 or 1-7, * is a linking point with an adjacent moiety,

[Chemical Formula 1-8]

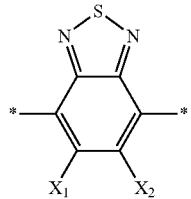

wherein, in Chemical Formula 1-8, R is hydrogen, a substituted or unsubstituted C1 to C40 aliphatic hydrocarbon group or a substituted or unsubstituted C6 to C30 aromatic hydrocarbon group, and * is a linking point with an adjacent moiety,

[Chemical Formula 1-9]

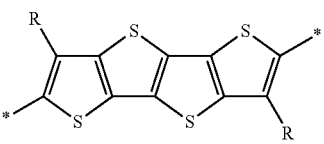

wherein, in Chemical Formula 1-9, $X_1$ and $X_2$ are independently halogen and * is a linking point with an adjacent moiety, and

[Chemical Formula 1-10]

wherein, in Chemical Formula 1-10, R's are independently hydrogen, a substituted or unsubstituted C1 to C40 aliphatic hydrocarbon group or a substituted or unsubstituted C6 to C30 aromatic hydrocarbon group, and * is a linking point with an adjacent moiety.

In example embodiments, the conjugation system may further include one of a substituted or unsubstituted phenylene group, a substituted or unsubstituted thiazoline group, a substituted or unsubstituted pyridine group, a substituted or unsubstituted naphthalene group, a substituted or unsubstituted anthracene group, a substituted or unsubstituted naphthacene group, a substituted or unsubstituted fluorene group, a substituted or unsubstituted carbazole group, a substituted or unsubstituted thienothiophene group, a substituted or unsubstituted thieno benzothiophene group, and a combination thereof.

In example embodiments, the organic semiconductor thin film may be a stretchable thin film.

According to example embodiments, a thin film transistor includes a gate electrode, a semiconductor layer including the organic semiconductor thin film, a gate insulating layer between the gate electrode and the semiconductor layer, and a source electrode and a drain electrode electrically connected to the semiconductor layer.

According to example embodiments, an electronic device includes the organic semiconductor thin film.

According to example embodiments, an electronic device includes the thin film transistor.

In example embodiments, the organic semiconductor thin film may satisfy electrical characteristic and stretchability simultaneously.

According to example embodiments, a composition includes an elastomer, a conjugation semiconductor polymer, and a solvent, wherein the conjugation semiconductor polymer and the elastomer are included in a weight ratio of about 70:30 to about 5:95.

In example embodiments, a solubility of the elastomer in the solvent may be different than a solubility of the conjugation semiconductor polymer in the solvent.

In example embodiments, the solvent may include one of chloroform, chlorobenzene, toluene, dimethylformaldehyde, tetrahydrofuran, dimethylsulfoxide, xylene, tetralin, and a combination thereof.

In example embodiments, the conjugation semiconductor polymer and the elastomer may be included in a weight ratio of about 50:50 to about 10:90.

According to example embodiments, a method of manufacturing an organic semiconductor thin film may include applying the composition on a substrate, and removing the solvent to form an organic semiconductor thin film. The organic semiconductor thin film may include a plurality of nanoconfined polymer structures and the plurality of nanoconfined polymer structures may form polymer networks in an upper surface layer and a lower surface layer of the organic semiconductor thin film.

In example embodiments, the applying of the composition may be performed by spin coating the composition of the substrate.

In example embodiments, the applying of the composition may include phase-separating the conjugation polymer from the elastomer.

In example embodiments, the method of manufacturing an organic semiconductor thin film may further include transferring the organic semiconductor thin film from the substrate to the elastic substrate.

According to example embodiments, an organic semiconductor thin film may include an elastomer and a plurality of nanoconfined polymer structures. The elastomer may include a first region, a second region, and a third region. The second region may be between the first region and the third region. The nanoconfined polymer structures may include a conjugation semiconductor polymer. The conjugation semiconductor polymer may include a repeating unit having at least one conjugation system in its main chain, and The nanoconfined polymer structures may form at least one of a first polymer network in the first region of the elastomer and a second polymer network in the third region of the elastomer.

In example embodiments, the conjugation semiconductor polymer and the elastomer may be included in a weight ratio of about 70:30 to about 5:95. The elastomer may include one of polybutadiene (PB), a styrene-butadiene copolymer (SB), a styrene-butadiene-styrene copolymer (SBS), a styrene-ethylene-butylene-styrene copolymer (SEBS), an ethylene propylene diene rubber (EPDR), an acrylic rubber, a polychloroprene rubber, polyurethane, a fluoro-rubber, a butyl rubber, a silicone rubber, and a combination thereof.

In example embodiments, the nanoconfined polymer structure may be a nanofibril having a continuous pathway. The nanofibril may have a diameter of less than or equal to about 50 nm.

In example embodiments, the conjugation system may include at least one moiety represented by one of Chemical Formulae 1-1 to 1-10.

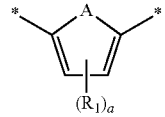

[Chemical Formula 1-1]

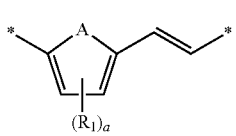

[Chemical Formula 1-2]

wherein, in Chemical Formula 1-1 or 1-2, A is O, S, Se, or NH, $R_1$ is a substituted or unsubstituted C1 to C40 aliphatic hydrocarbon group, a substituted or unsubstituted C6 to C30 aromatic hydrocarbon group, or a halogen, a is an integer ranging from 0 to 2 (or 1 to 2), and * is a linking point with an adjacent moiety,

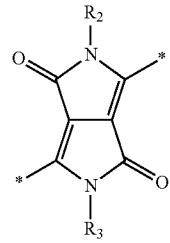

[Chemical Formula 1-3]

wherein, in Chemical Formula 1-3, $R_2$ and $R_3$ are independently hydrogen, a substituted or unsubstituted C1 to C40 aliphatic hydrocarbon group or a substituted or unsubstituted C6 to C30 aromatic hydrocarbon group, and * is a linking point with an adjacent moiety,

[Chemical Formula 1-4]

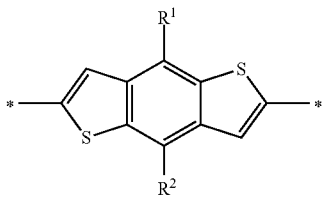

wherein, in Chemical Formula 1-4, $R^1$ and $R^2$ are independently hydrogen, a substituted or unsubstituted C1 to C40 aliphatic hydrocarbon group or a substituted or unsubstituted C6 to C30 aromatic hydrocarbon group, and * is a linking point with an adjacent moiety,

[Chemical Formula 1-5]

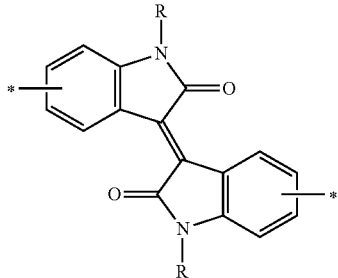

wherein, in Chemical Formula 1-5, R is independently hydrogen, a substituted or unsubstituted C1 to C40 aliphatic hydrocarbon group or a substituted or unsubstituted C6 to C30 aromatic hydrocarbon group, and * is a linking point with an adjacent moiety,

[Chemical Formula 1-6]

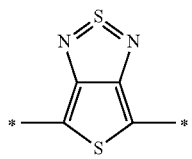

[Chemical Formula 1-7]

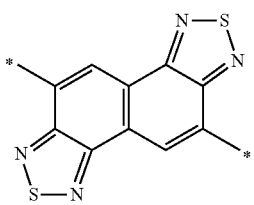

wherein, in Chemical Formula 1-6 or 1-7, * is a linking point with an adjacent moiety,

[Chemical Formula 1-8]

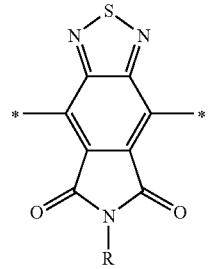

wherein, in Chemical Formula 1-8, R is hydrogen, a substituted or unsubstituted C1 to C40 aliphatic hydrocarbon group or a substituted or unsubstituted C6 to C30 aromatic hydrocarbon group, and * is a linking point with an adjacent moiety,

[Chemical Formula 1-9]

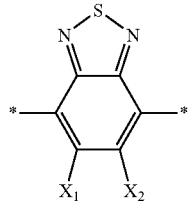

wherein, in Chemical Formula 1-9, $X_1$ and $X_2$ are independently halogen and * is a linking point with an adjacent moiety, and

[Chemical Formula 1-10]

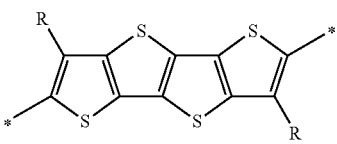

wherein, in Chemical Formula 1-10, R's are independently hydrogen, a substituted or unsubstituted C1 to C40 aliphatic hydrocarbon group or a substituted or unsubstituted C6 to C30 aromatic hydrocarbon group, and * is a linking point with an adjacent moiety.

In example embodiments, a thin film transistor may include a gate electrode, a semiconductor layer including the organic semiconductor thin film, a gate insulating layer between the gate electrode and the semiconductor layer, and a source electrode and a drain electrode electrically connected to the semiconductor layer.

BRIEF DESCRIPTION OF THE DRAWINGS

The foregoing and other features of inventive concepts will be apparent from the more particular description of non-limiting embodiments with reference to the following drawings.

DETAILED DESCRIPTION

Figure 1:
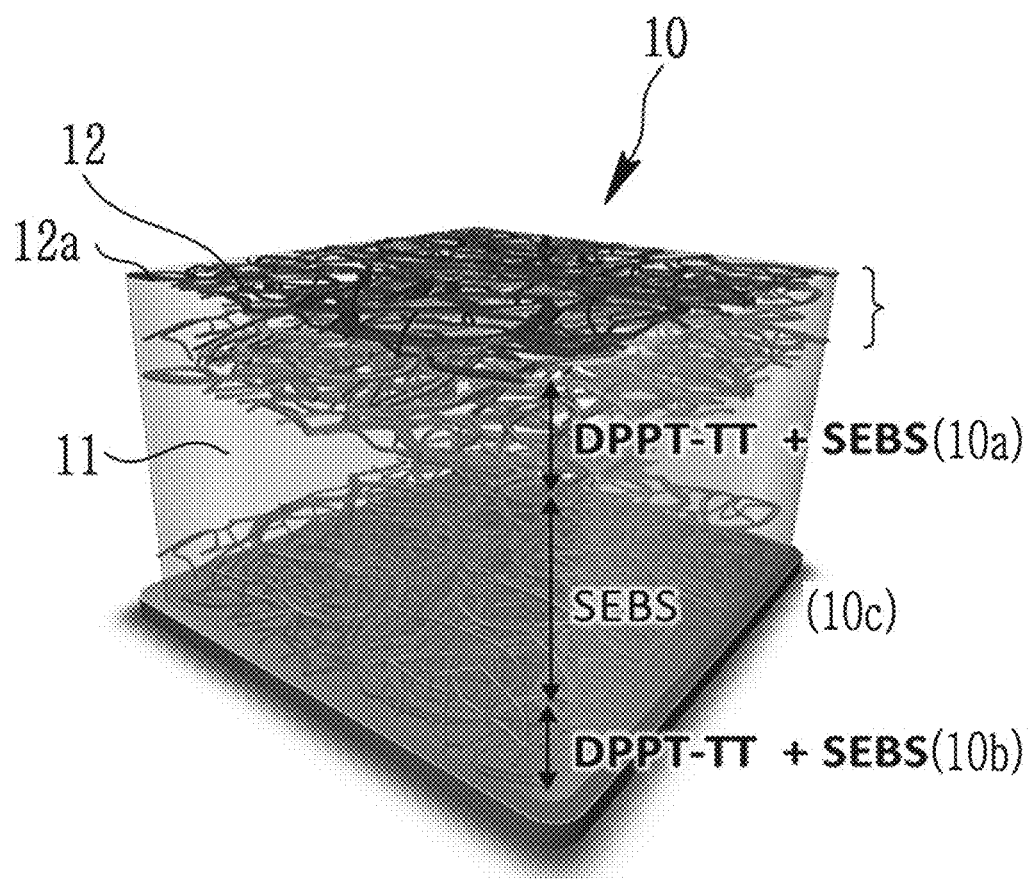
FIG. 1 is a schematic view showing a structure of an organic semiconductor thin film according to one embodiment.

Hereinafter, example embodiments will be described in detail with reference to the accompanying drawings. This disclosure may, however, be embodied in many different forms and is not construed as limited to the example embodiments set forth herein.

As used herein, when a definition is not otherwise provided, 'substituted' refers to replacement of hydrogen of a compound by a substituent selected from a halogen, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C1 to C20 haloalkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

Hereinafter, 'combination' refers to a mixture or a stack structure of two or more.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that when a first element such as a layer, film, region, or substrate is referred to as being "on" a second element, it can be directly on the other element or intervening elements may also be present. In contrast, when an element is referred to as being "directly on" another element, there are no intervening elements present.

As used herein, the term "conjugated system" refers to a system (a moiety) of connected p-orbitals with delocalized electrons in molecules with alternating single and multiple bonds (e.g., a double bond), which in general may lower the overall energy of the molecule and increase stability. The moiety may be cyclic, acyclic, linear, or mixed. I Hereinafter, an organic semiconductor thin film according to example embodiments is described.

Figure 2:
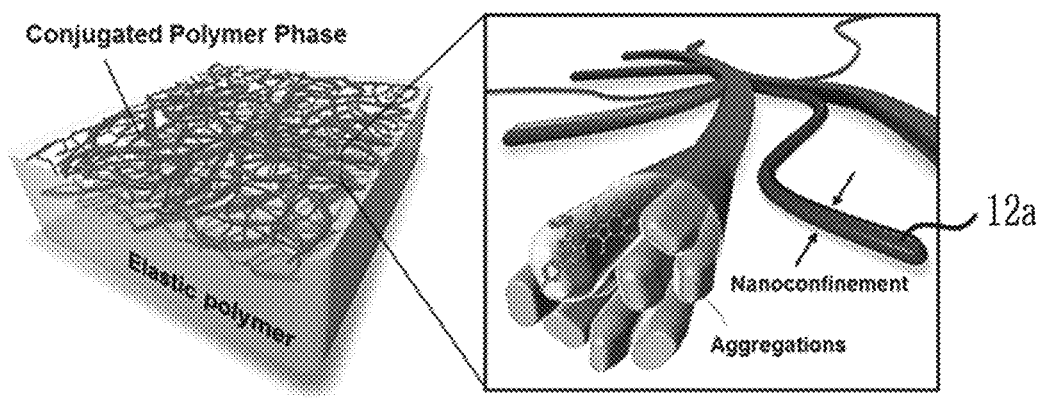
FIG. 2 is a schematic view enlarging a part of the nanoconfined polymer structure of FIG. 1.

FIG. 1 is a schematic view showing a structure of an organic semiconductor thin film according to example embodiments and FIG. 2 is an enlarged schematic view of a part of the nanoconfined polymer structure of FIG. 1.

An organic semiconductor thin film 10 according to example embodiments includes a matrix 11 including an elastomer and a plurality of nanoconfined polymer structures 12a embedded in the matrix and forming a polymer network.

The elastomer is not particularly limited and may be any material having a desired (and/or alternatively predetermined) elasticity, for example an elastic polymer, for example a soft elastic polymer, for example an elastic rubber.

The elastomer may include for example polybutadiene (PB), a styrene-butadiene copolymer (SB), a styrene-butadiene-styrene copolymer (SBS), a styrene-ethylene-butylene-styrene copolymer (SEBS), an ethylene propylene diene rubber (EPDR), an acrylic rubber, a polychloroprene rubber, polyurethane, a fluoro-rubber, a butyl rubber, a silicone rubber, or a combination thereof, but is not limited thereto.

The nanoconfined polymer structures 12a may be a nanofibril having a continuous pathway, for example, a nanofibril having a diameter in nano level. The nanofibril may have a diameter, for example, less than or equal to about 100 nm, within the range, a diameter of less than or equal to about 80 nm, within the range, a diameter of less than or equal to about 50 nm. The nanofibril may have a diameter of, for example, about 1 nm to about 100 nm, within the range, a diameter of about 1 nm to about 80 nm, within the range, a diameter of about 1 to about 50 nm.

The nanoconfined polymer structures 12a may include a conjugation semiconductor polymer including a repeating unit having at least one conjugation system in its main chain, and for example as shown in FIG. 2, the nanoconfined polymer structures 12a may include aggregations of the conjugation semiconductor polymer. The plurality of nanoconfined polymer structures 12a may be entangled in a web-like structure to form a polymer network 12.

The conjugation semiconductor polymer may be any semiconductor polymer having a conjugation structure without limitation, and may be for example a donor-acceptor type polymer having an electron donating moiety and an electron accepting moiety.

For example, the conjugation system may include at least one of moieties represented by Chemical Formulae 1-1 to 1-10, but is not limited thereto.

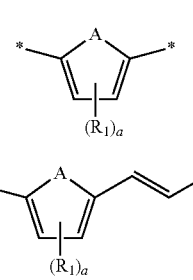

[Chemical Formula 1-1]

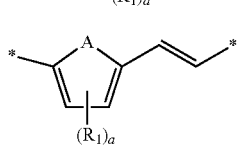

[Chemical Formula 1-2]

wherein, in Chemical Formula 1-1 or 1-2, A is O, S, Se, or NH, $R_1$ is a substituted or unsubstituted C1 to C40 aliphatic hydrocarbon group, a substituted or unsubstituted C6 to C30 aromatic hydrocarbon group, or a halogen, a is an integer ranging from 0 to 2 (or 1 to 2), and * is a linking point with an adjacent moiety,

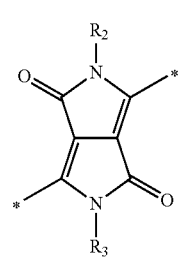

[Chemical Formula 1-3]

wherein, in Chemical Formula 1-3, $R_2$ and $R_3$ are independently hydrogen, a substituted or unsubstituted C1 to C40 aliphatic hydrocarbon group or a substituted or unsubstituted C6 to C30 aromatic hydrocarbon group, and * is a linking point with an adjacent moiety,

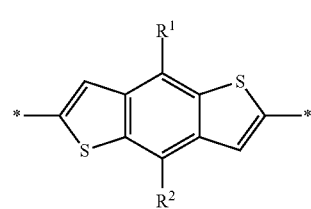

[Chemical Formula 1-4]

wherein, in Chemical Formula 1-4, $R^1$ and $R^2$ are independently hydrogen, a substituted or unsubstituted C1 to C40 aliphatic hydrocarbon group or a substituted or unsubstituted C6 to C30 aromatic hydrocarbon group, and * is a linking point with an adjacent moiety,

[Chemical Formula 1-5]

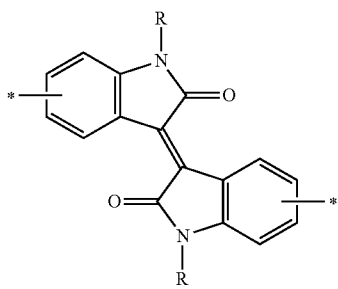

wherein, in Chemical Formula 1-5, R is independently hydrogen, a substituted or unsubstituted C1 to C40 aliphatic hydrocarbon group or a substituted or unsubstituted C6 to C30 aromatic hydrocarbon group, and * is a linking point with an adjacent moiety,

[Chemical Formula 1-6]

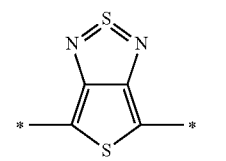

[Chemical Formula 1-7]

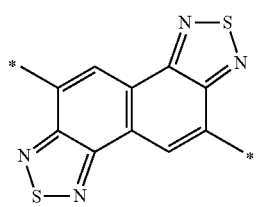

wherein, in Chemical Formula 1-6 or 1-7, * is a linking point with an adjacent moiety,

[Chemical Formula 1-8]

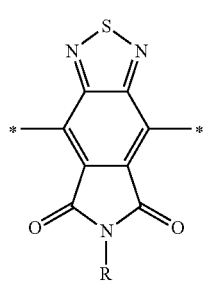

wherein, in Chemical Formula 1-8, R is hydrogen, a substituted or unsubstituted C1 to C40 aliphatic hydrocarbon group or a substituted or unsubstituted C6 to C30 aromatic hydrocarbon group, and * is a linking point with an adjacent moiety,

[Chemical Formula 1-9]

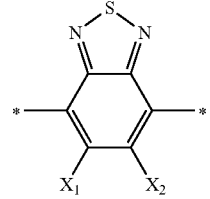

wherein, in Chemical Formula 1-9, $X_1$ and $X_2$ are independently halogen and * is a linking point with an adjacent moiety, and

[Chemical Formula 1-10]

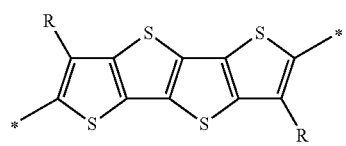

wherein, in Chemical Formula 1-10, R's are independently hydrogen, a substituted or unsubstituted C1 to C40 aliphatic hydrocarbon group or a substituted or unsubstituted C6 to C30 aromatic hydrocarbon group, and * is a linking point with an adjacent moiety.

The conjugation system may further include, for example a substituted or unsubstituted phenylene group, a substituted or unsubstituted thiazoline group, a substituted or unsubstituted pyridine group, a substituted or unsubstituted naphthalene group, a substituted or unsubstituted anthracene group, a substituted or unsubstituted naphthacene group, a substituted or unsubstituted fluorene group, a substituted or unsubstituted carbazole group, a substituted or unsubstituted thienothiophene group, a substituted or unsubstituted thieno benzothiophene group, or a combination thereof in addition to the moieties, but is not limited thereto.

The conjugation semiconductor polymer may have a weight average molecular weight of greater than or equal to about 50,000, for example about 50,000 to about 1,000,000, or about 50,000 to about 500,000.

The plurality of nanoconfined polymer structures 12a may be formed by various methods, and may be for example formed by mixing the conjugation semiconductor polymer with the elastomer and performing phase-separation. The plurality of nanoconfined polymer structures 12a may be distributed in a different amount in a thickness direction of the organic semiconductor thin film 10 by phase-separation and the plurality of nanoconfined polymer structures 12a may be mainly distributed in an upper surface layer and a lower surface layer of the organic semiconductor thin film 10. In other words, the organic semiconductor thin film 10 may include a upper surface layer 10a and a lower surface layer 10b where nanoconfined polymer structures 12a are mainly present and a intermediate layer 10c mainly filled with matrix 11. In other words, the nanoconfined polymer structures 12a may be absent (or substantially absent) from the intermediate layer 10c. The upper surface layer 10a, intermediate layer 10c, and lower surface layer 10b, and may also be referred to as a first region, a second region, and a third region respectively.

In the plurality of nanoconfined polymer structures 12a, the chain dynamics may be enhanced from decreased length of cooperative movement and reduced interpenetration/ packing density with limited space for polymer chains and the increased free surface percentage, which are caused by the nanoconfinement effect. Therefore, the nanoconfinement effect may help to change several physical characteristics of the conjugation semiconductor polymer, for example, it may decrease a mechanical modulus, increase a mechanical ductility, increase a mechanical stretchability, and decrease a crystallization.

Thus, the organic semiconductor thin film 10 may have a low modulus and a low crystallization compared to the thin film including only conjugation semiconductor polymer, so as to enhance a stretchability. Accordingly, the organic semiconductor thin film 10 may be a stretchable thin film. In addition, even when the organic semiconductor thin film 10 is stretched, a charge transfer pathway is maintained through a polymer network, so as to substantially keep electrical characteristics.

In addition, the organic semiconductor thin film 10 may have a surface morphology to obtain a high stretchability by introducing a lot of deformable interfaces into a plurality of nanoconfined structures 12a formed in each of the upper surface layer and the lower surface layer of the organic semiconductor thin film 10 by, for example, a phase separation.

The morphology of the organic semiconductor thin film 10 may be affected by a ratio of the elastomer and the conjugation semiconductor polymer in the organic semiconductor thin film 10. For example, a nanoconfined polymer structure 12a having a small diameter may be obtained when the amount of the elastomer is relatively high. For example, the conjugation semiconductor polymer and the elastomer may be included in a weight ratio of about 70:30 to about 5:95, within the range, for example, at a weight ratio of about 60:40 to about 5:95, within the range, for example, at a weight ratio of about 50:50 to about 10:90. For example, the elastomer may be included more than the conjugation semiconductor polymer.

Thereby, even in the case that the organic semiconductor thin film 10 is stretched in a desired (and/or alternatively predetermined) direction, it may have stable electrical characteristics due to a low crystallization while maintaining networks between polymer chains of the conjugation semiconductor polymer.

Hereinafter, a method of manufacturing the organic semiconductor thin film 10 according to example embodiments is described.

A method of manufacturing the organic semiconductor thin film 10 according to example embodiments includes preparing a composition for an organic semiconductor thin film, applying the composition on a substrate, and removing the solvent to form an organic semiconductor thin film.

The composition for an organic semiconductor thin film includes an elastomer, a conjugation semiconductor polymer, and a solvent.

The elastomer and the conjugation semiconductor polymer are the same as described above.

The elastomer may be included in an amount of about 0.3 to about 20 parts by weight, for example about 0.5 to about 15 parts by weight or about 1 to about 15 parts by weight relative to 1 part by weight of the conjugation semiconductor polymer. For example, the elastomer may be included more than the conjugation semiconductor polymer.

The solvent is not particularly limited as long as it phase-separates the elastomer and the conjugation semiconductor polymer. For example, the solvent may have the different solubility for each of the elastomer and the conjugation semiconductor polymer. For example, the solvent may have low solubility for the conjugation semiconductor polymer. The solvent may include one of chloroform, chlorobenzene, toluene, dimethylformaldehyde, tetrahydrofuran, dimethylsulfoxide, xylene, tetralin, and a combination thereof, but is not limited thereto.

The substrate may be for example a glass substrate, a semiconductor substrate (e.g., Si substrate), or a polymer substrate, but is not limited thereto. The applying of the composition on the substrate may be for example performed by spin coating, slit coating, bar coating, dip coating, spray coating, inkjet printing, and the like, but is not limited thereto. The applying of the composition may be performed by spin coating.

The applying the composition may include phase-separating the elastomer and the conjugation polymer. The phase-separation may be performed by a sequential precipitation process when is coated by, for example, a spin coating. For example, the conjugation semiconductor polymer having a low solubility may be precipitated to provide aggregations, and the solvent is removed at a state that the aggregations form a polymer network by, for example, spinning and are transported into upper and lower, thereby, a upper surface layer and a lower surface layer where the conjugation semiconductor polymer are mostly distributed and an intermediate layer filled with mostly the elastomer may be separated.

The organic semiconductor thin film 10 manufactured as above may be transferred on an elastic substrate and for example the organic semiconductor thin film 10 is transferred from the substrate to the elastic substrate by contacting the elastic substrate with the organic semiconductor thin film 10 and removing the substrate.

The organic semiconductor thin film may be applied to various electronic devices, for example a thin film transistor and may be for example applied to a charge transport layer and/or an active layer of an electronic device such as a solar cell, an organic light emitting diode (OLED) display, and an organic sensor. In addition, the electronic device may be a stretchable organic light emitting diode (OLED) display, a stretchable human motion sensor, a stretchable artificial muscle, or a stretchable actuator.

Hereinafter, an example embodiment of a thin film transistor including organic semiconductor thin film is described with reference to the drawing.

Figure 3:
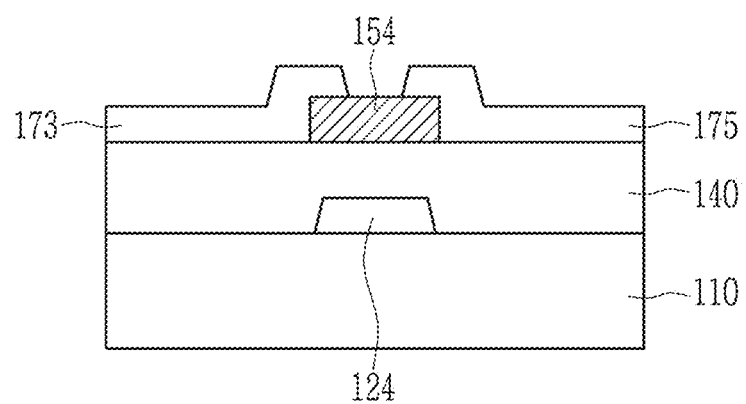
FIG. 3 is a cross-sectional view of a thin film transistor according to one embodiment.
Figure 4:
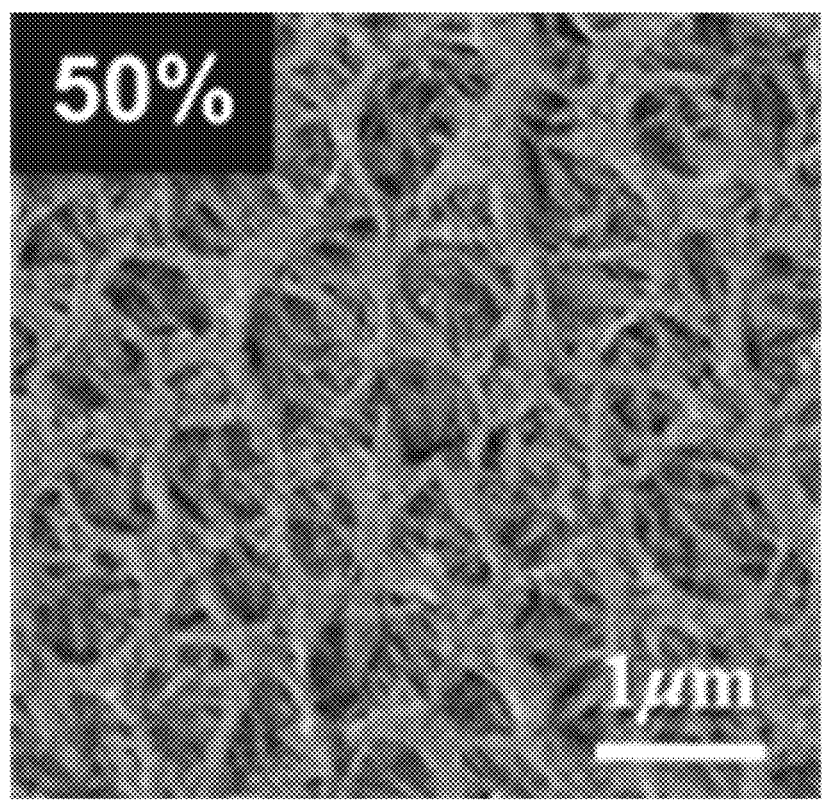
FIGS. 4 to 7 are AFM phase images showing a lower surface layer of an organic semiconductor thin film at a SEBS fraction of each 50 wt %, 70 wt %, 90 wt % and 95 wt %, respectively.
Figure 5:
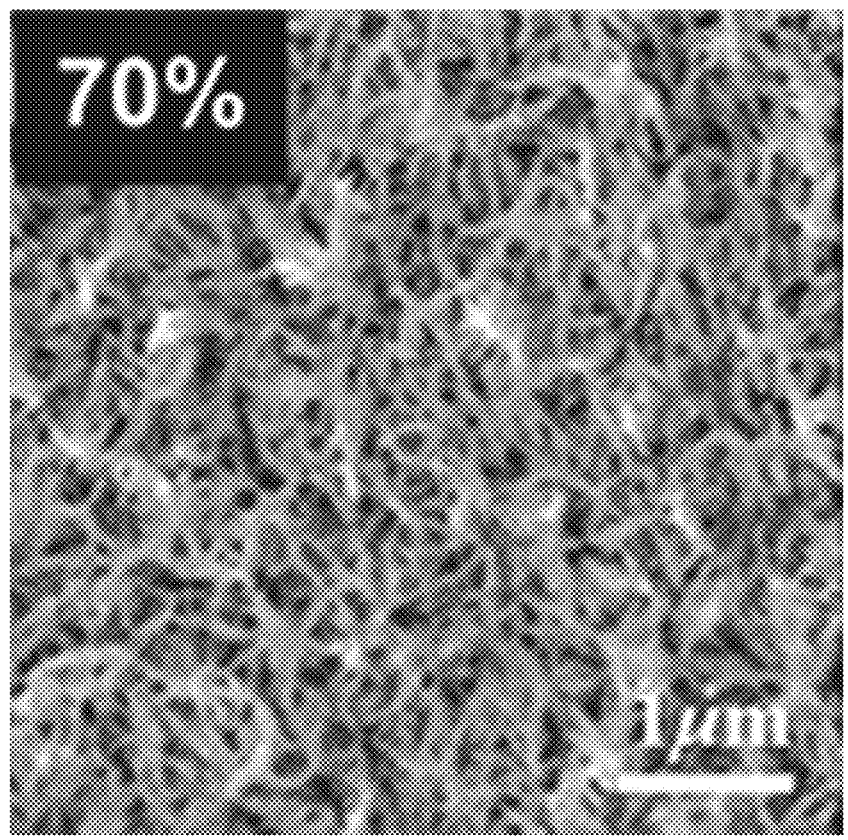
Figure 6:
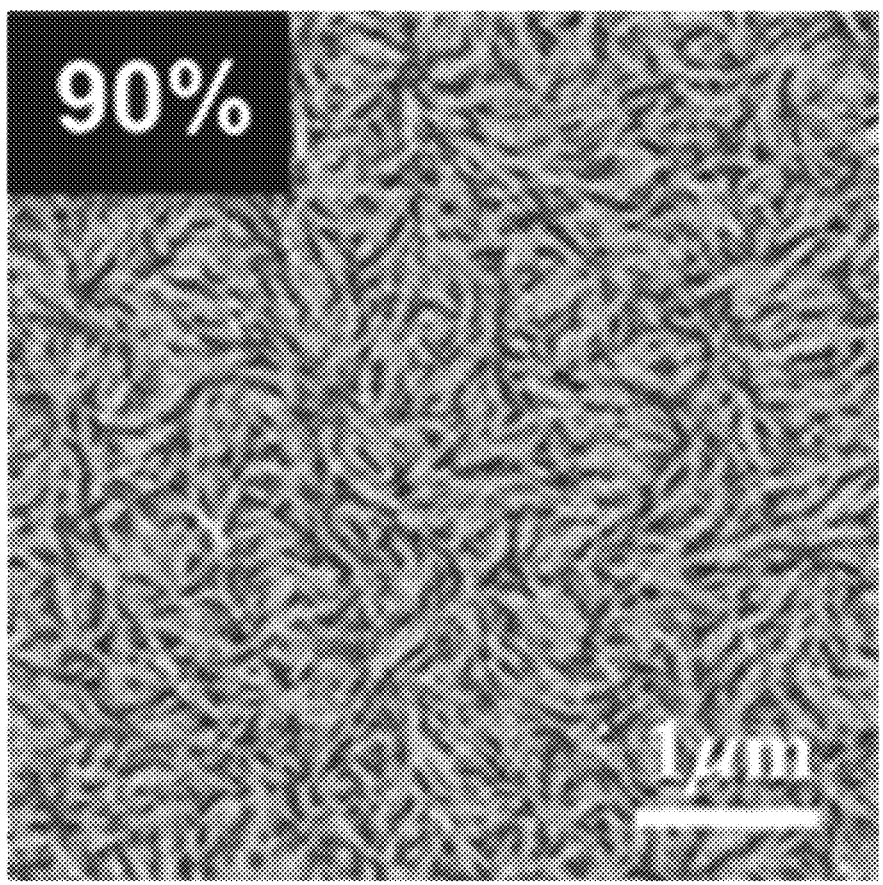
Figure 7:
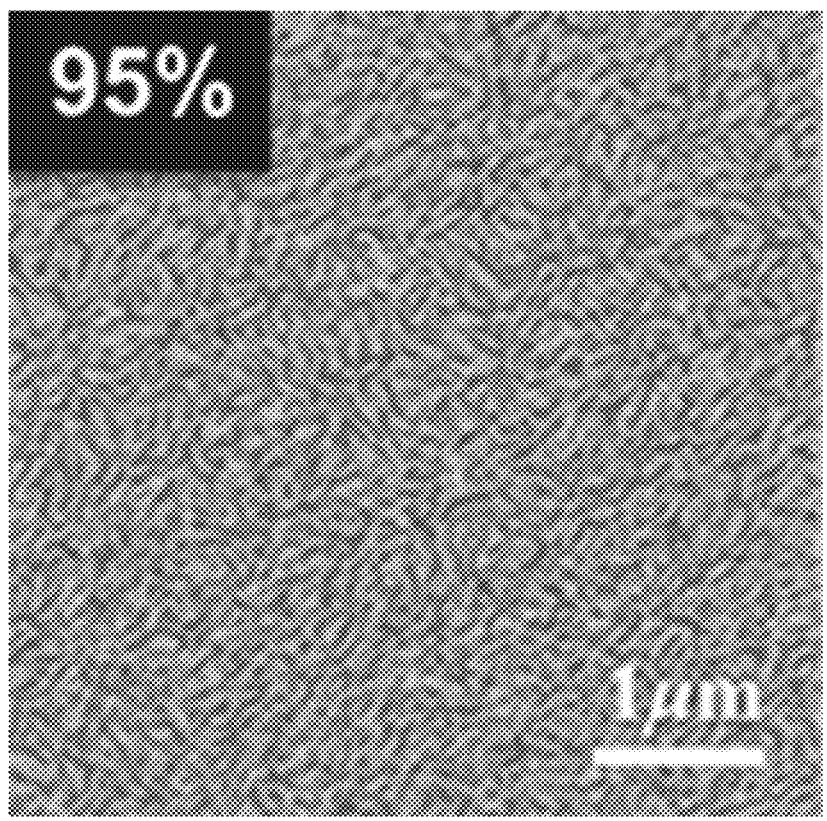

FIG. 3 is a cross-sectional view of a thin film transistor according to example embodiments.

A gate electrode 124 is formed on a substrate 110 made of transparent glass, silicon, or plastic. The gate electrode 124 is connected to a gate line (not shown) transferring a gate signal. The gate electrode 124 may be doped at a high concentration in a silicon substrate or may be made of gold (Au), copper (Cu), nickel (Ni), aluminum (Al), molybdenum (Mo), chromium (Cr), tantalum (Ta), titanium (Ti), an alloy thereof, or a combination thereof.

A gate insulating layer 140 is formed on the gate electrode 124. The gate insulating layer 140 may be made of an organic material or an inorganic material, and examples of the organic material may be polyvinyl alcohol-based compound, a polyimide-based compound, a polyacryl-based compound, a polystyrene-based compound, a soluble polymer compound such as benzocyclobutane (BCB) and examples of the inorganic material may be silicon nitride ($SiN_x$) and silicon oxide ($SiO_2$).

A semiconductor 154 is formed on the gate insulating layer 140. The semiconductor 154 may be the organic semiconductor thin film. The semiconductor 154 may be for example formed by the manufacturing method using the composition.

A source electrode 173 and a drain electrode 175 electrically connected to the semiconductor 154 are formed on the semiconductor 154. The source electrode 173 and the drain electrode 175 face each other with the gate electrode 124 therebetween. The source electrode 173 is electrically connected to the data line (not shown) transferring the data signal. The source electrode 173 and the drain electrode 175 may include at least one metal selected from gold (Au), copper (Cu), nickel (Ni), aluminum (Al), molybdenum (Mo), chromium (Cr), tantalum (Ta), titanium (Ti), an alloy thereof, or a combination thereof.

Although a thin film transistor having a top contact/bottom gate structure is shown in FIG. 3, example embodiments are not limited thereto. Inventive concepts may be applied to all thin film transistors such as a bottom contact/top gate structure, a bottom contact/bottom gate structure, a top contact/top gate structure in the same manner.

The thin film transistor may be applied to a switching or driving device of various electronic devices and the electronic device may be for example a liquid crystal display (LCD), an organic light emitting diode (OLED) display, an electrophoretic display, an organic photoelectric device, and an organic sensor, but is not limited thereto.

Hereinafter, example embodiments are illustrated in more detail with reference to examples. However, these examples are illustrative, and the scope of claims is not limited thereto.

Materials

All solvents such as chlorobenzene, cyclohexane and trichloroethylene may be purchased from Sigma-Aldrich.

Conjugation semiconductor polymers: DPPT-TT, P-29-DPPDTSE, PffBT4T-2DT and P(DPP2TTVT) were synthesized according to known methods, and polymer PTDPPTFT4 was obtained from Corning Incorporated. The polymers have a number average molecular weight (Mn), a weight average molecular weight (Mw) and polydispersity (PDI) shown in the following Table 1:

TABLE 1

|  | Mn* | Mw | PDI |
| --- | --- | --- | --- |
| DPPT-TT | 27.0 | 100.1 | 3.7 |
| P-29-DPPDTSE | 34.0 | 72.3 | 2.13 |
| PffBT4T-2DT | 49.6 | 70.1 | 1.41 |
| P (DPP2TTVT) | 20.4 | 65.4 | 3.2 |

*The number average molecular weight is measured using an eluent of 1,2,4-trichlorobenzene at 180° C. with a polystyrene standard by a gel permeation chromatography.

Structural formulas of the conjugation polymers in Table 1 are provided below.

i) DPPT-TT: poly[3,6-di-2-thienyl-pyrrolo[3,4-c]pyrrole-1,4-dione-alt-thieno[3,2-b]thiophene]

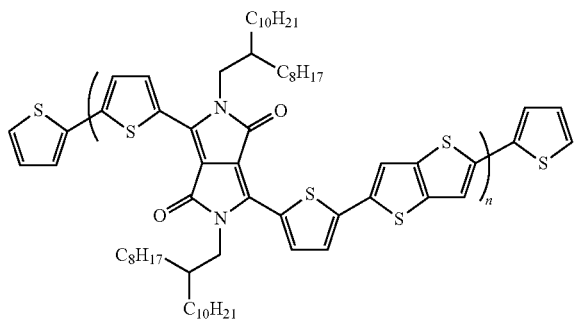

ii) P-29-DPPDTSE: poly-[2,5-bis(7-decylnonadecyl)pyrrolo[3,4-c]pyrrole-1,4-(2H,5H)-dione-(E)-(1,2-bis(5-(thiophen-2-yl)selenophen-2-yl)ethene)]

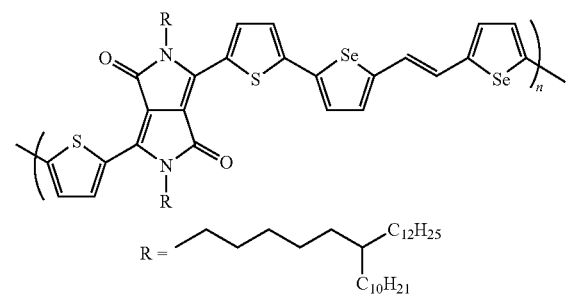

iii) PffBT4T-2DT: poly[(5,6-difluoro-2,1,3-benzothiadiazol-4,7-diyl)-alt-(3,3'''-di(2-decyltetradecyl)-2,2';5',2'';5''',2'-quaterthiophen-5,5'-diyl)]

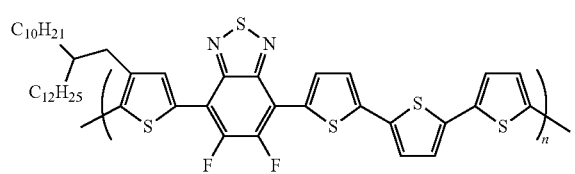

iv) P(DPP2TTVT): poly[2,5-bis(4-decyltetradecyl)pyrrolo[3,4-c]pyrrole-1,4-(2H,5H)-dione-(E)-1,2-di(2,2'-bithiophen-5-yl)ethene]

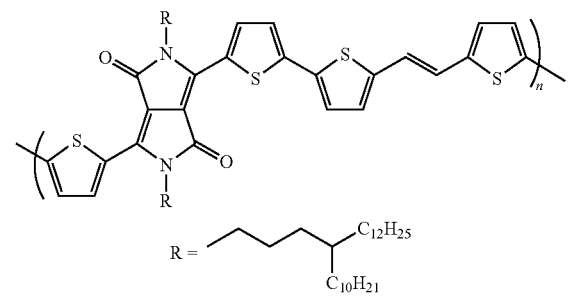

v) PTDPPTFT4: poly(tetrathienoacene-diketopyrrolopyrrole)

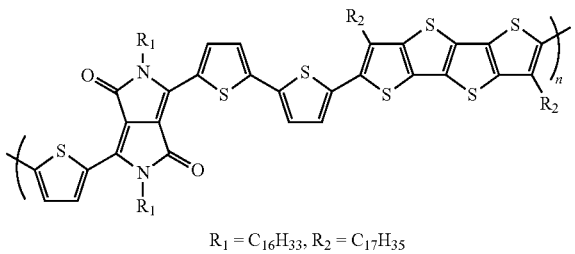

$R_1 = C_{16}H_{33}, R_2 = C_{17}H_{35}$

Elastomer:
SEBS (polystyrene-block-poly(ethylene-co-butylene)-block-polystyrene, H1221, poly(ethylene-co-butylene) volume fraction 88%), Asahi Kasei company,
Elastic substrate (for stacking and stretching stamp): poly(dimethylsiloxane) (PDMS, Sylgard 184, Dow Corning) is prepared at a rate of 20:1 (base/cross-linker, w/w) and cured at 80° C. for overnight.

Example 1

The polymer solution was prepared using chlorobenzene with DPPT-TT and SEBS at a desired (and/or alternatively predetermined) ratio at 90° C. for 1 hour. Each polymer solution was prepared at a concentration of 10 mg/ml and 3 mg/ml, and the hot polymer solution was directly dripped on a OTS-treated SiOx substrate and spin-coated at 1000 rpm for 1 minute, and then annealed under the nitrogen atmosphere at 150° C. for 1 hour to provide an organic semiconductor thin film.

Comparative Example 1

Figure 8:
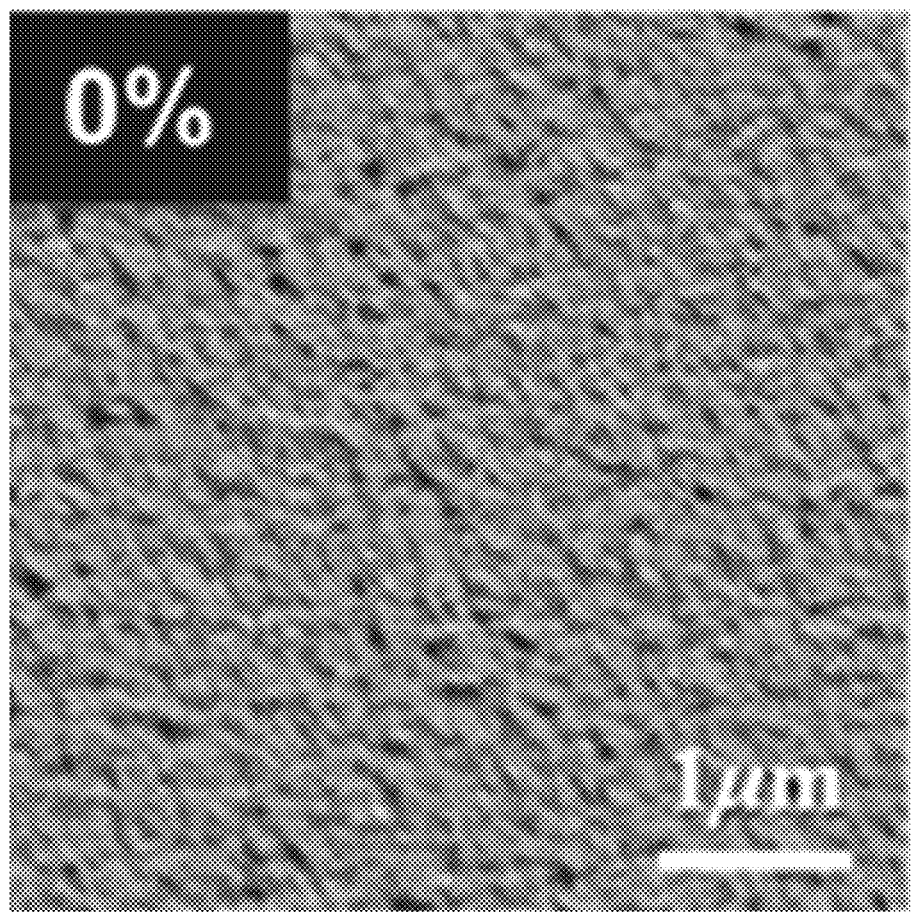
FIG. 8 is a AFM phase image showing an organic semiconductor thin film according to Comparative Example 1 (SEBS: 0 wt %).
Figure 9:
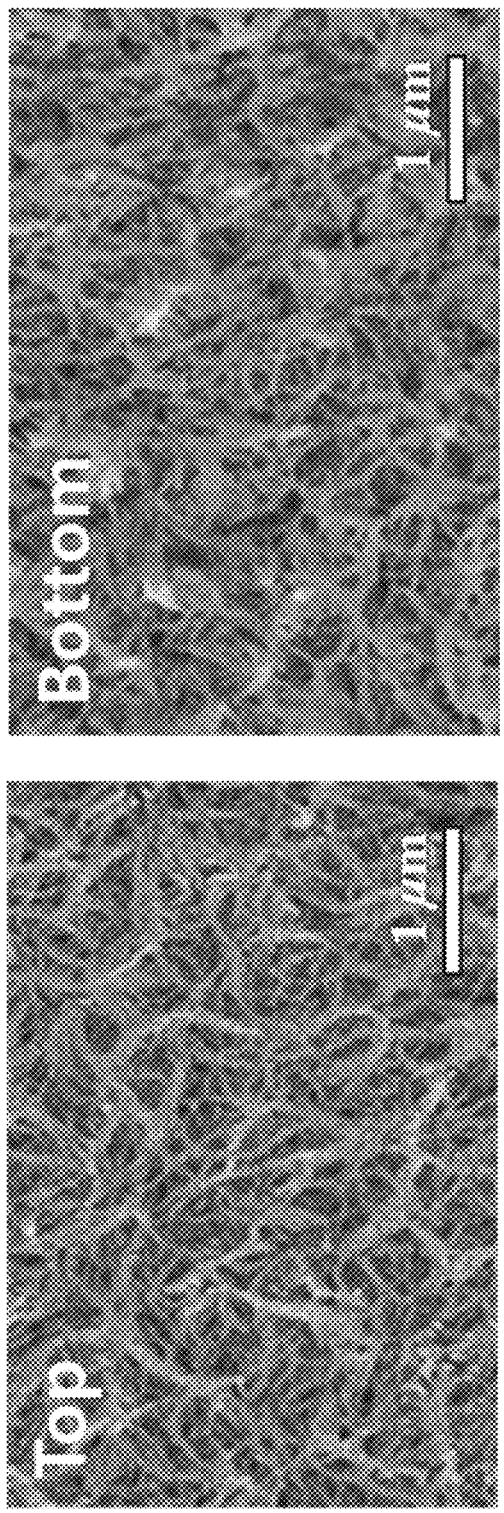
FIG. 9 shows AFM phase images of a upper surface layer and a lower surface layer of an organic semiconductor thin film according to Example 1 (DPPT-TT:SEBS=30:70 wt/wt).

An organic semiconductor thin film is prepared with only DPPT-TT but no elastomer (SEBS).
Evaluation 1
The organic semiconductor thin film is evaluated for a morphology according to a ratio of DPPT-TT and SEBS.
FIGS. 4 to 7 are AFM phase images of lower surface layers of organic semiconductor thin films having a SEBS fraction of 50 wt %, 70 wt %, 90 wt % and 95 wt %, respectively; and FIG. 8 is a AFM phase image showing an organic semiconductor thin film according to Comparative Example 1 (SEBS: 0 wt %).
Referring to FIGS. 4 to 7, it is confirmed that the conjugation semiconductor polymer phase forms a desirable nanoconfined polymer network, and it is formed in nanofibril having the smaller diameter as the elastomer has the higher concentration. On the contrary, referring to FIG. 8, it is confirmed that the nanoconfined polymer network is not found in the organic semiconductor thin film according to Comparative Example 1.
Evaluation 2
The upper surface layer and the lower surface layer of the organic semiconductor thin film according to Example 1 (DPPT-TT:SEBS=30:70 wt/wt) are observed by an atomic force microscope (AFM).
FIG. 9 shows AFM phase images of a upper surface layer and a lower surface layer of an organic semiconductor thin film according to Example 1 (DPPT-TT:SEBS=30:70 wt/wt).

Figure 10:
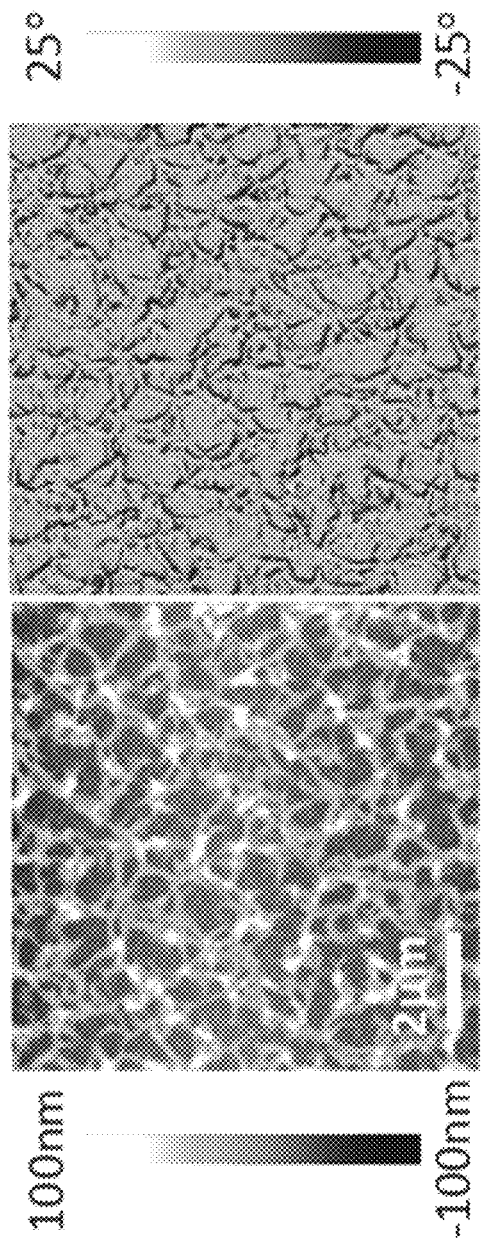
FIG. 10 shows AFM height and phase images of a nanoconfined polymer structure including DPPT-TT
Figure 11:
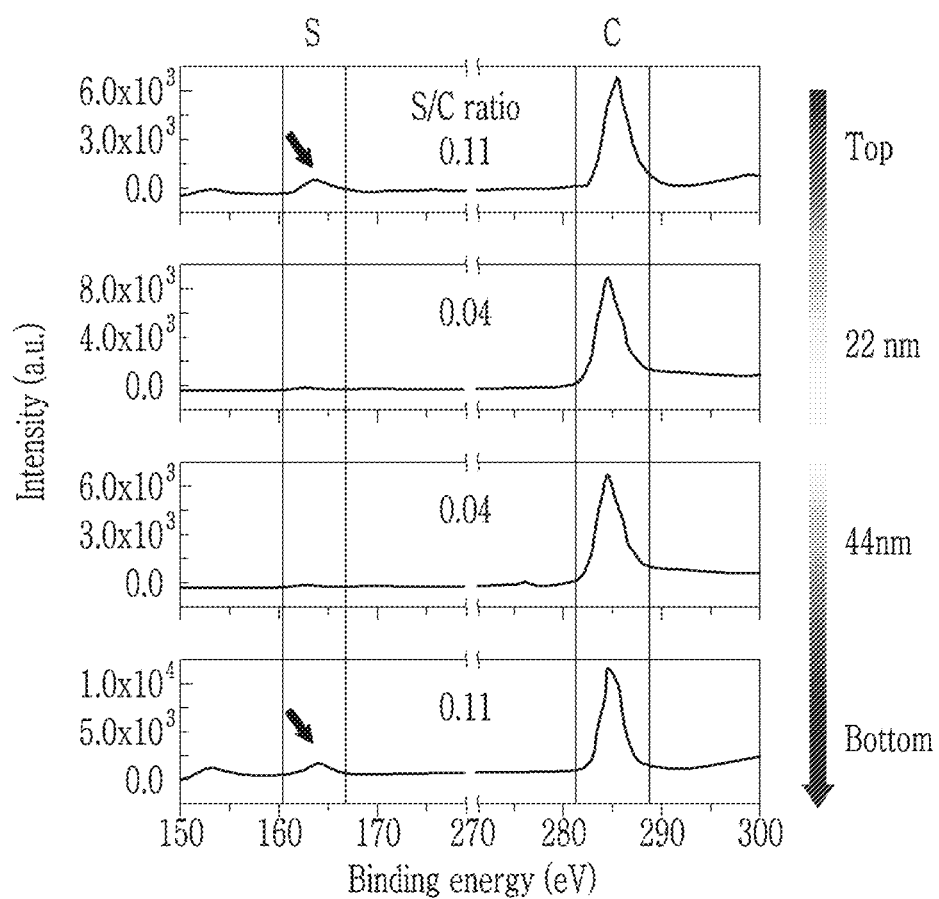
FIG. 11 is a XPS spectrum showing a morphology change along with a thickness direction of an organic semiconductor thin film.
Figure 12:
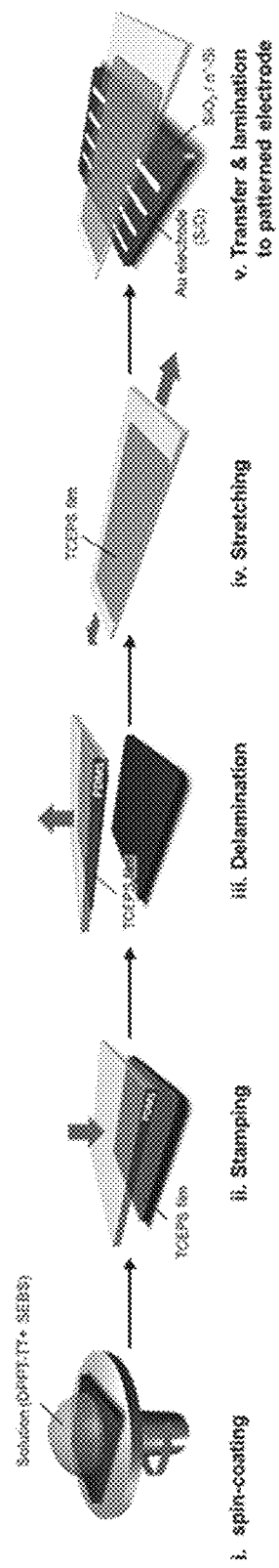
FIG. 12 is a schematic view exemplarily showing a soft contact lamination method.
Figure 13:
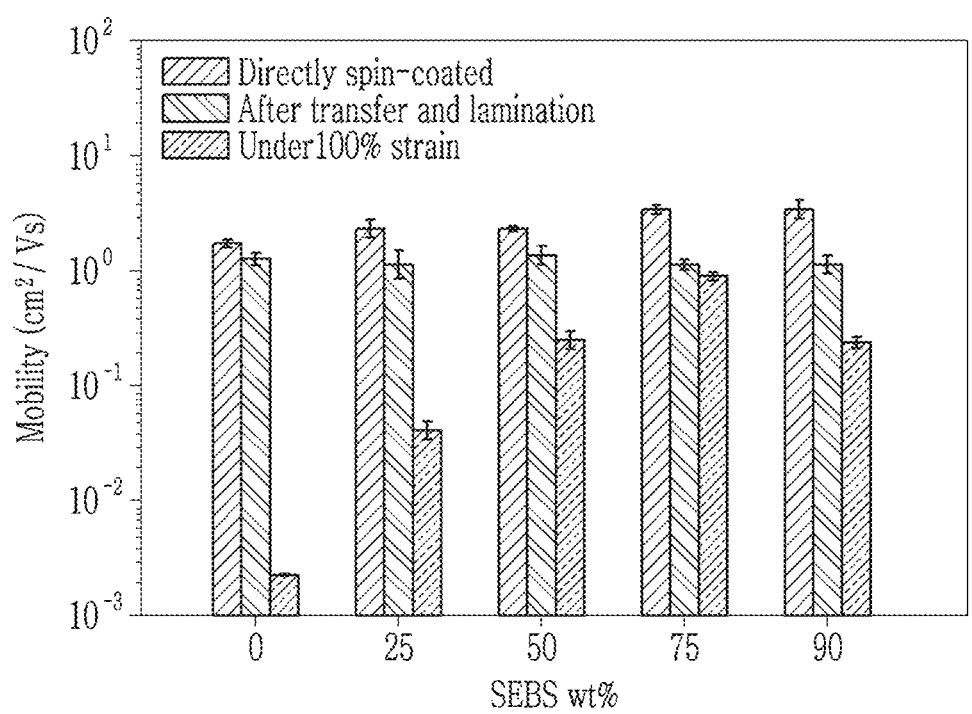
FIG. 13 is a graph showing a charge mobility of five TCEPS thin films having different SEBS fractions (0 wt % to 90 wt %) at the early stage and after stretching under a 100% strain.

Referring to FIG. 9, it is confirmed that each of the upper surface layer and the lower surface layer of the organic semiconductor thin film has a morphology of nanopartitioned polymer in which a lot of deformable interfaces are introduced.
Evaluation 3
SEBS is removed from the organic semiconductor thin film according to Example 1 (DPPT-TT:SEBS=30:70 wt/wt) using cyclohexane, and then a morphology of the nanoconfined polymer structure including DPPT-TT is monitored.
FIG. 10 shows a height and a phase photographs of AFM of the nanoconfined polymer structure including DPPT-TT.
Referring to FIG. 10, it is confirmed that the nanoconfined polymer structure including DPPT-TT has a web-like nanofibril structure.
Evaluation 4
The morphology change of the organic semiconductor thin film according to Example 1 (DPPT-TT:SEBS=30:70 wt/wt) is monitored according to a thickness direction.
The morphology change of the organic semiconductor thin film according to the thickness direction may be monitored by a X-ray photoelectron spectroscopy (XPS) combined with a sputtering etching method.
FIG. 11 is a XPS spectrum showing the morphology change of the organic semiconductor thin film according to a thickness direction.
Referring to FIG. 11, it may monitor the change of S 2p peak and C 1s peak in the XPS spectrum. As S atom is present only in DPPT-TT, the ratio of the S 2p peak and the C1s peak may show the content of DPPT-TT in a different depth. From FIG. 11, it is confirmed that DPPT-TT is mostly distributed in the upper surface layer (Top) and the lower surface layer (Bottom) and SEBS is filled between the upper surface layer and the lower surface layer in the structure.
Evaluation 5
The electrical performance of the organic semiconductor thin film is measured in a thin film transistor (TFT) having a bottom gate/bottom contact structure.
A semiconductor solution is spin-coated on a bottom gate transistor stack to provide a basic performance of the organic semiconductor thin film. In order to accurately and effectively evaluate a mobility of the semiconductor layer under the different strain, the TFT is fabricated using a soft contact lamination method.
FIG. 12 is a schematic view showing a soft contact lamination method as one example.
As shown in FIG. 12, a spin coated organic semiconductor thin film is prepared (i); the organic semiconductor thin film is transferred from OTS (octadecyltrichlorosilane)-assembled 300 nm SiO₂/Si substrate to a PDMS slab (ii); it is delaminated (iii); the PDMS slab is stretched under a different strain from each other (iv); and the strain-applied PDMS slab is directly laminated on the bottom gate transistor stack (v).
The ratio of elastomer (SEBS) is an important factor determining a morphology of the organic semiconductor thin film, so as to evaluate the effects on the electrical performance and the stretchability.
FIG. 13 is a graph showing a charge mobility of five organic semiconductor thin films having different SEBS fractions (0 wt % to 90 wt %) at an initial stage and after being stretched under a strain of 100%.
Referring to FIG. 13, it is confirmed that the mobility of five organic semiconductor thin films having different SEBS fractions (0 wt % to 90 wt %) at an initial stage is slightly increased as the SEBS fraction is getting increased, which is probably due to a higher degree of aggregation in the conjugated polymers at higher SEBS fraction with maintained continuous charge transport pathway.

When stretched to 100% strain, the mobility of the semiconductor thin film according to Comparative Example 1 including only DPPT-TT and 0 wt % of SEBS is significantly reduced; on the other hand, the mobility of the semiconductor thin films including DPPT and SEBS at 100% strain has an increasing trend with the SEBS fraction up to about 70 wt %. With the SEBS fraction of about 90 wt %, the mobility gets lower, possibly due to the strain-induced decrease of DPPT-TT network density to a level below the percolation limit for continuous charge transport pathway. At a SEBS fraction of about 70 wt %, it is confirmed that the mobility after being stretched under a 100% strain is rarely deteriorated and is maintained by about 1.32 $cm^2V^{-1}s^{-1}$.

Figure 14:
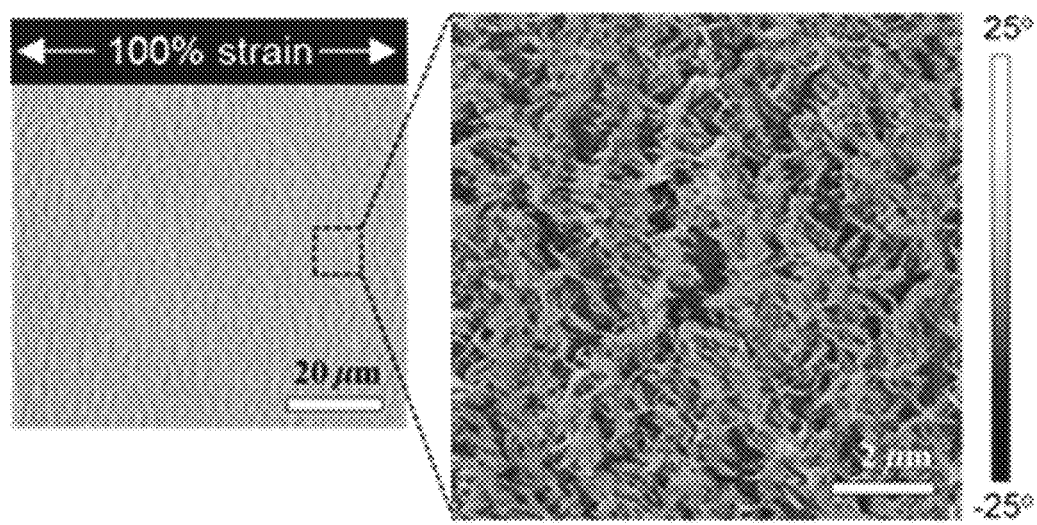
FIG. 14 is an optical microscopic image and a AFM phase image showing a morphology of the organic semiconductor thin film according to Example 1 (DPPT-TT:SEBS=30:70 wt/wt) after stretching under a 100% strain.
Figure 15:
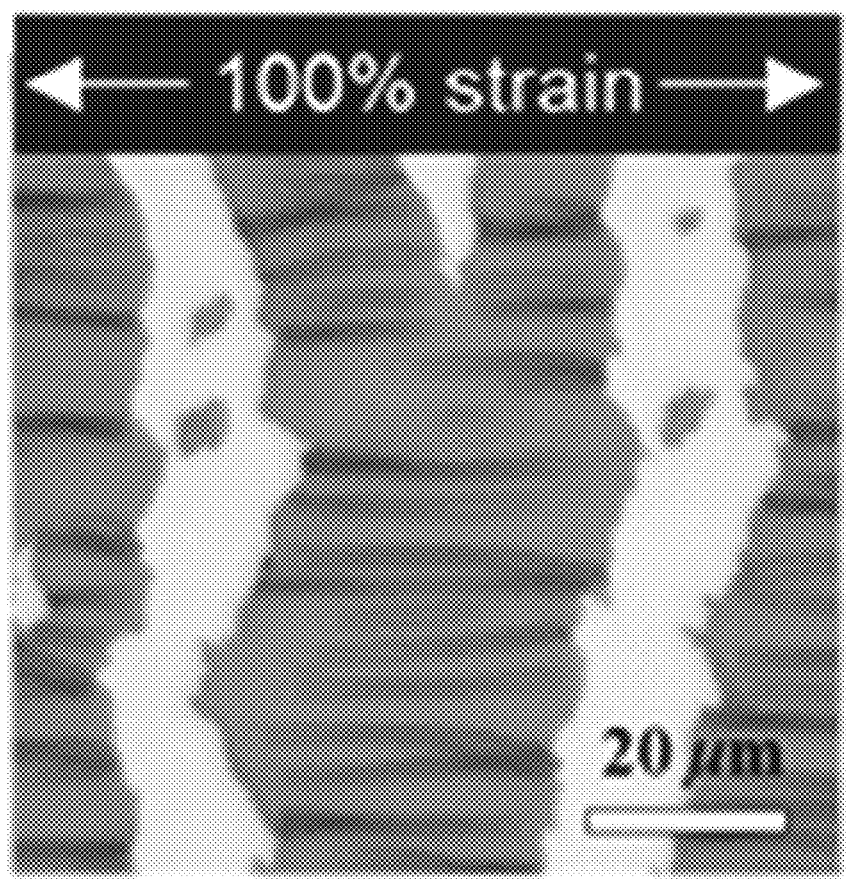
FIG. 15 is an optical microscopic image showing a morphology of the semiconductor thin film according to Comparative Example 1 after stretching under a 100% strain.

FIG. 14 shows an optical microscopic image and an AFM phase image of a morphology of the organic semiconductor thin film according to Example 1 (DPPT-TT:SEBS=30:70 wt/wt) after being stretched under a 100% strain; FIG. 15 is an optical microscopic image showing a morphology of the semiconductor thin film according to Comparative Example 1 after being stretched under a 100% strain.

Referring to FIGS. 14 and 15, upon stretching to 100% strain on PDMS substrate, big cracks with a width around 20 μm developed in the semiconductor thin film according to Comparative Example 1, while the organic semiconductor thin film according to Example 1 (DPPT-TT:SEBS=30:70 wt/wt) only has some nanoimprints that do not break continuity of the film.

Evaluation 6

The organic semiconductor thin film according to Example 1 (DPPT-TT:SEBS=30:70 wt/wt) is evaluated for electrical characteristics according to a stretching direction.

Figure 16:
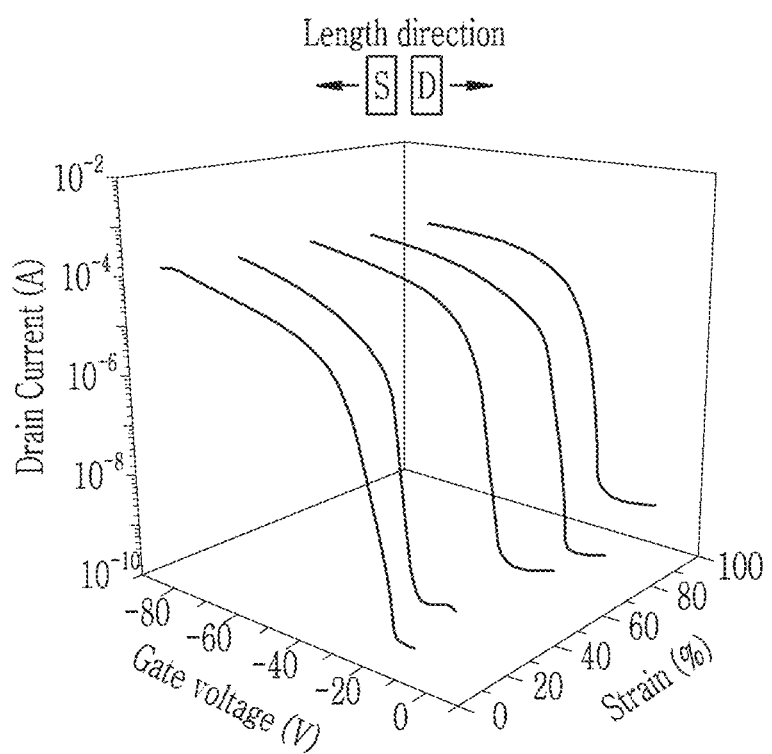
FIG. 16 shows a TFT transfer curve (Vd=−80V) when an organic semiconductor thin film according to Example 1 (DPPT-TT:SEBS=30:70 wt/wt) is strained in a channel direction of a thin film transistor.
Figure 17:
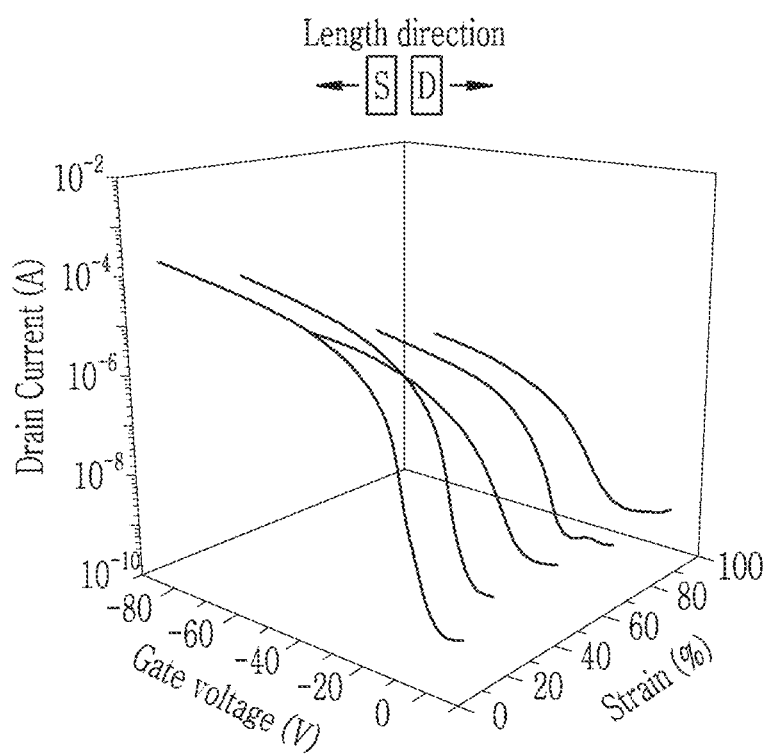
FIG. 17 shows a TFT transfer curve (Vd=−80V) when an organic semiconductor thin film according to Comparative Example 1 is strained in a channel direction of a thin film transistor.
Figure 18:
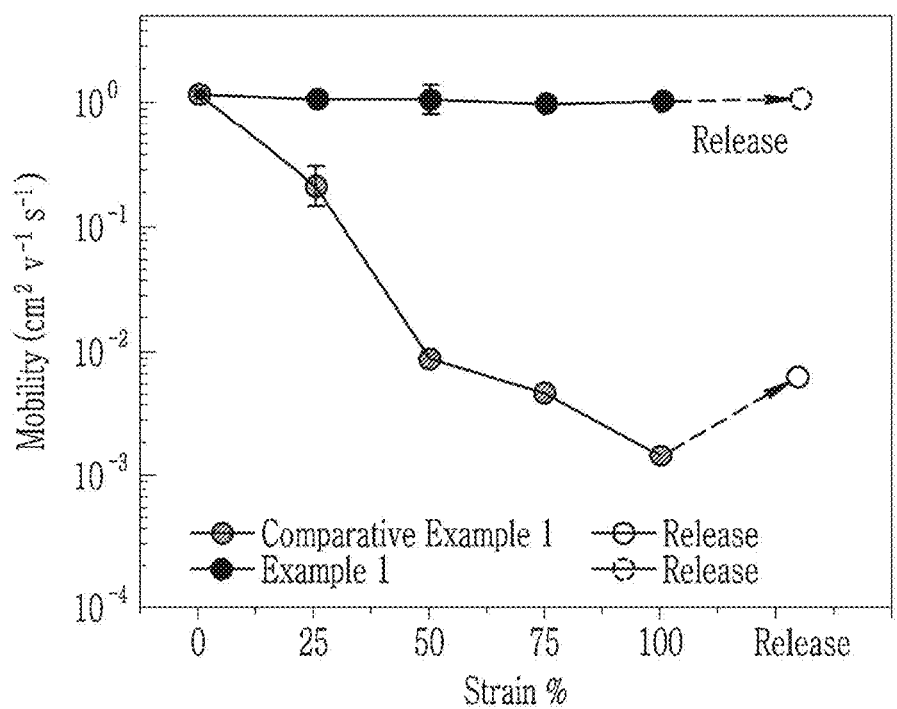
FIG. 18 is a graph showing a charge mobility change when an organic semiconductor thin film according to Example 1 (DPPT-TT:SEBS=30:70 wt/wt) and an organic semiconductor thin film according to Comparative Example 1 are strained in a channel direction of a thin film transistor.

FIG. 16 shows a TFT transfer curve (Vd=−80V) when the organic semiconductor thin film according to Example 1 (DPPT-TT:SEBS=30:70 wt/wt) is strained in a channel direction (length direction) of a thin film transistor; FIG. 17 is a TFT transfer curve (Vd=−80V) when the organic semiconductor thin film according to Comparative Example 1 is strained in a channel direction of a thin film transistor; FIG. 18 is a graph showing a charge mobility change when the organic semiconductor thin film according to Example 1 (DPPT-TT:SEBS=30:70 wt/wt) and the organic semiconductor thin film according to Comparative Example 1 are strained in a channel direction (length direction) of the thin film transistor.

Referring to FIGS. 16 and 18, for the organic semiconductor thin film according to Example 1 (DPPT-TT:SEBS=30:70 wt/wt), the gradually increased strain up to 100% induces little change in the transfer curves in the strain-parallel direction, with the on-current almost maintained same. There is almost no decrease in the mobility as well during the entire stretching process. As a result, the mobility at 100% strain reached an unprecedentedly high value of 1.32 $cm^2$/Vs in maximum and 1.08 $cm^2$/Vs in average. As a comparison, referring to FIGS. 17 and 18, the transfer curves of the organic semiconductor thin film according to Comparative Example 1 changes dramatically as a result of the parallel strain, with both the on-current and the mobility decrease by almost 3 orders of magnitudes at 100% strain. Such significantly improved strain-tolerance of the organic semiconductor thin film according to Example 1 comes from the maintained connection of the nanofibril network, even in the strain-induced nanoimprint areas.

Figure 19:
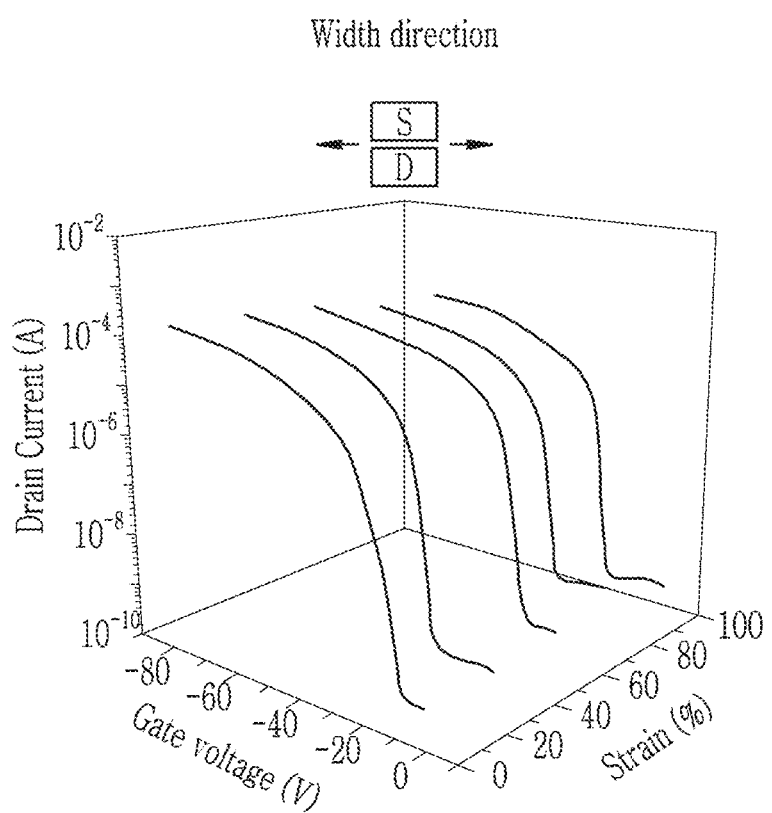
FIG. 19 is a TFT transfer curve (Vd=−80V) when an organic semiconductor thin film according to Example 1 (DPPT-TT:SEBS=30:70 wt/wt) is strained in a direction vertical to a channel direction of a thin film transistor.
Figure 20:
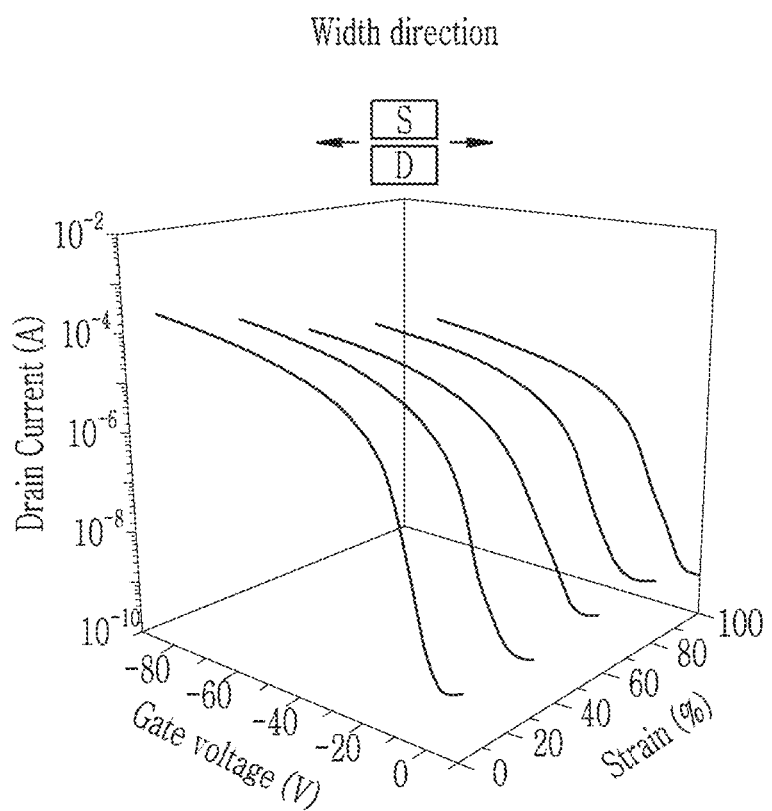
FIG. 20 is a TFT transfer curve (Vd=−80V) when an organic semiconductor thin film according to Comparative Example 1 is strained in a direction vertical to a channel direction of a thin film transistor.

FIG. 19 is a TFT transfer curve (Vd=−80V) when the organic semiconductor thin film according to Example 1 (DPPT-TT:SEBS=30:70 wt/wt) is strained in a direction (width direction) vertical to the channel direction of the TFT; FIG. 20 is a TFT transfer curve (Vd=−80V) when the organic semiconductor thin film according to Comparative Example 1 is strained in a direction (width direction) vertical to the channel direction of the TFT; and FIG. 21 is a graph showing a charge mobility change when the organic semiconductor thin film according to Example 1 (DPPT-TT:SEBS=30:70 wt/wt) and the organic semiconductor thin film according to Comparative Example 1 are strained in a direction (width direction) vertical to a channel direction of the thin film transistor.

Figure 21:
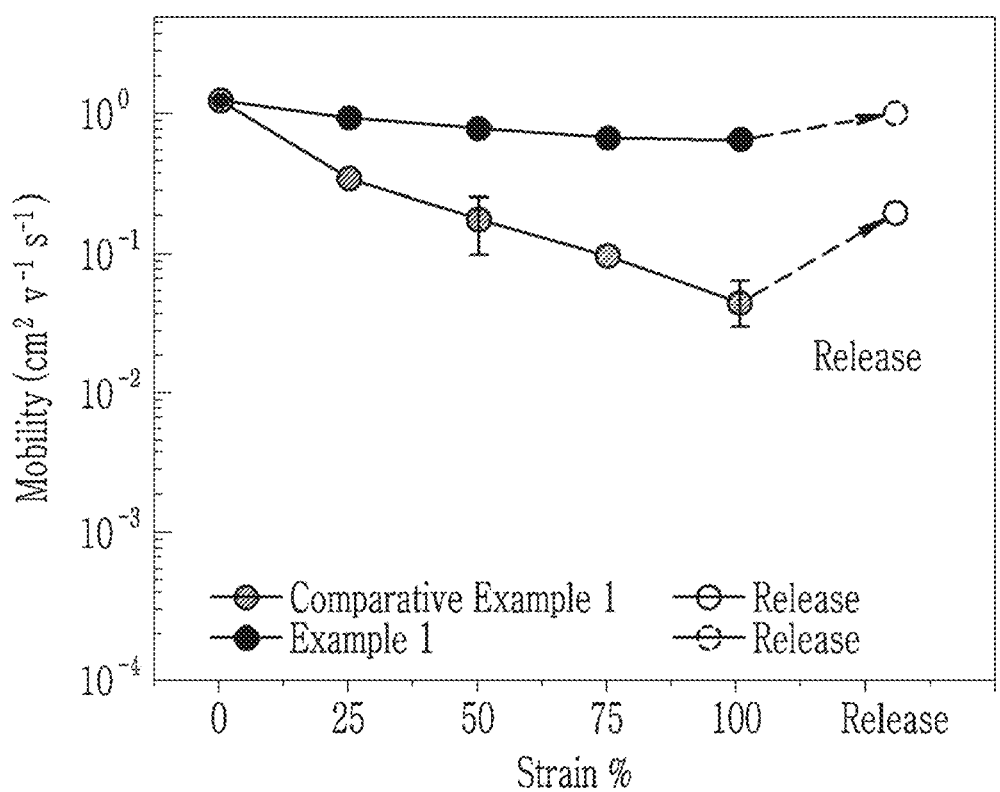
FIG. 21 is a graph showing a charge mobility change when an organic semiconductor thin film according to Example 1 (DPPT-TT:SEBS=30:70 wt/wt) and an organic semiconductor thin film according to Comparative Example 1 are strained in a direction vertical to a channel direction of a thin film transistor.

Referring to FIGS. 19 to 21, when the charge transport channel is perpendicular to the strain direction, there are also very little decreases in the on-current and the mobility of the organic semiconductor thin film according to Example 1 (DPPT-TT:SEBS=30:70 wt/wt) at 100% strain, which is a significant improvement compared to the almost 2 orders of magnitude decrease in the organic semiconductor thin film according to Comparative Example 1.

Evaluation 7

For the evaluation of the robustness, the organic semiconductor thin film according to Example 1 (DPPT-TT:SEBS=30:70 wt/wt) is evaluated for electrical characteristics according to multiple-cycle straining.

The effects of the multiple-cycle straining are evaluated by measuring the electrical performance after each cycle of stretching-releasing with 100% strain, up to 100 cycles.

Figure 22:
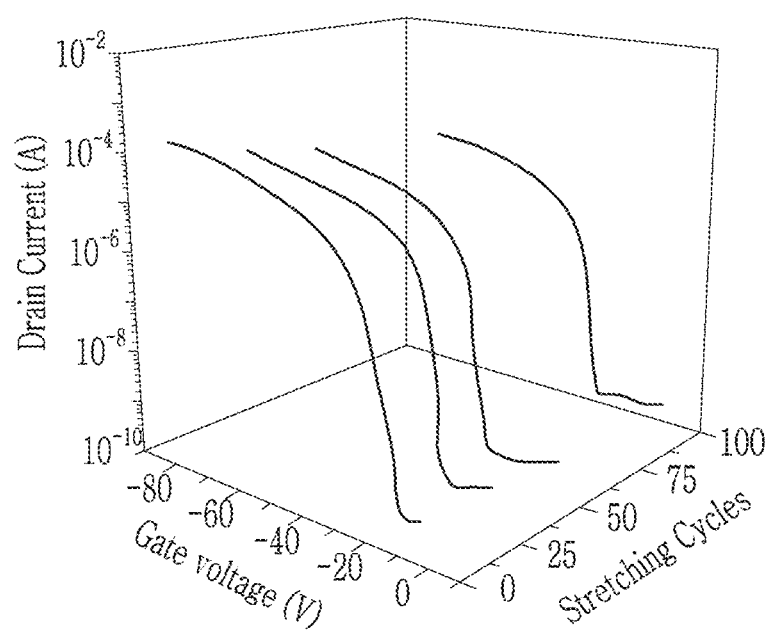
FIG. 22 is a TFT transfer curve (Vd=−80V) of an organic semiconductor thin film according to Example 1 (DPPT-TT:SEBS=30:70 wt/wt) when performing under a 100% strain for 100 cycles.
Figure 23:
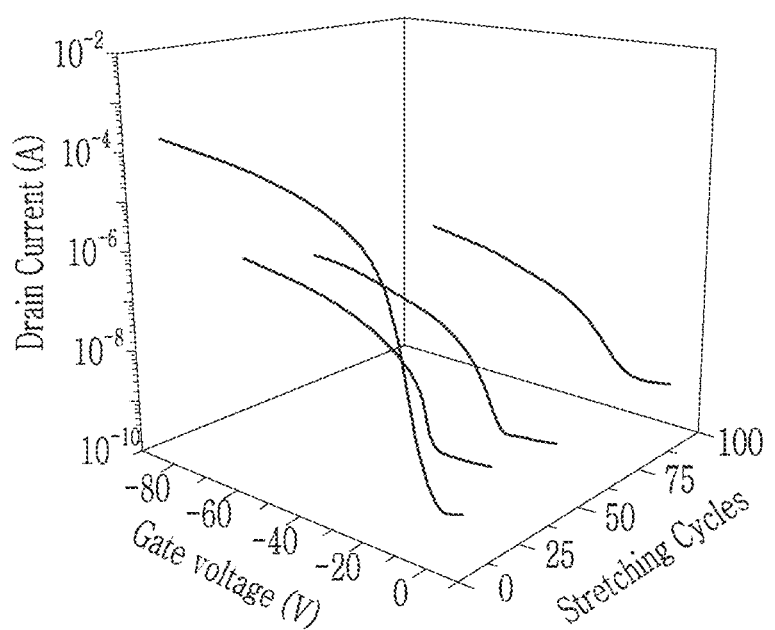
FIG. 23 is a TFT transfer curve (Vd=−80V) of an organic semiconductor thin film according to Comparative Example 1 when performing under a 100% strain for 100 cycles.

FIG. 22 is a TFT transfer curve (Vd=−80V) of the organic semiconductor thin film according to Example 1 (DPPT-TT:SEBS=30:70 wt/wt) when performing under a 100% strain for 100 cycles; FIG. 23 is a TFT transfer curve (Vd=−80V) of the organic semiconductor thin film according to Comparative Example 1 when performing under a 100% strain for 100 cycles; and FIG. 24 is a graph showing a charge mobility change when the organic semiconductor thin film according to Example 1 (DPPT-TT:SEBS=30:70 wt/wt) and the organic semiconductor thin film according to Comparative Example 1 are performed under a 100% strain for 100 cycles.

Figure 24:
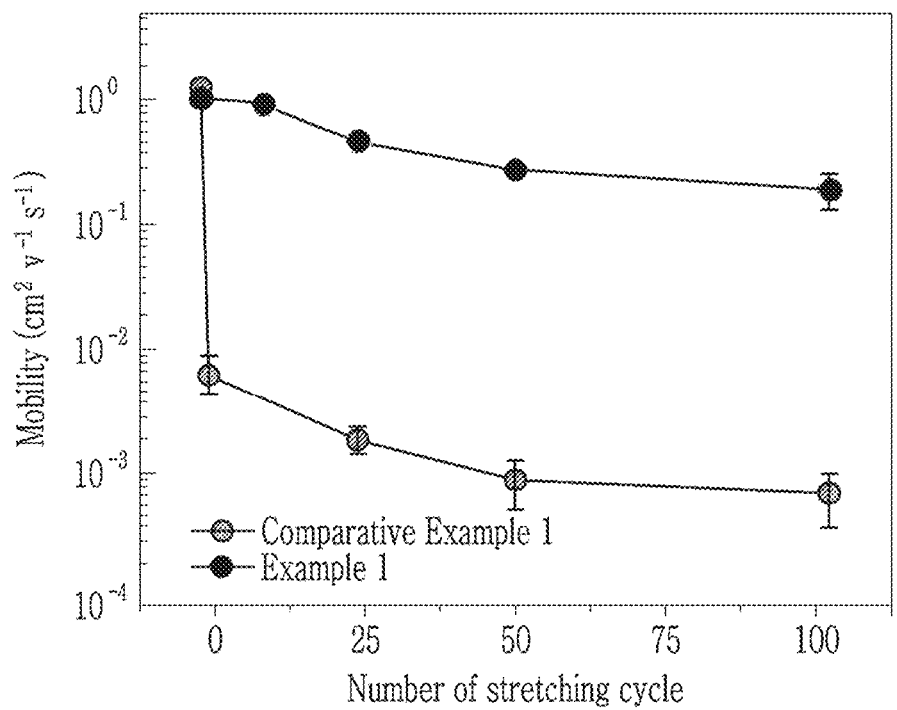
FIG. 24 is a graph showing a charge mobility change when an organic semiconductor thin film according to Example 1 (DPPT-TT:SEBS=30:70 wt/wt) and an organic semiconductor thin film according to Comparative Example 1 are performed under a 100% strain for 100 cycles.

Referring to FIGS. 22 and 24, the transfer curves of the organic semiconductor thin film according to Example 1 (DPPT-TT:SEBS=30:70 wt/wt) only changes moderately after 100 cycles, with the on-current decreased less than 1 order of magnitude compared to the original value. The mobility of the organic semiconductor thin film according to Example 1 (DPPT-TT:SEBS=30:70 wt/wt) also maintains a fairly high value of 0.3 cm2/Vs. As a comparison, referring to FIGS. 23 and 24, both the on-current and the mobility of the organic semiconductor thin film according to Comparative Example 1 decreases dramatically by over 2 orders of magnitudes after the first cycle, and decreased further by 1 order in the following 99 cycles. it is confirmed that the transfer curve of the organic semiconductor thin film according to Example 1 (DPPT-TT:SEBS=30:70 wt/wt) after 100 cycles is slightly changed according to gradually increasing a strain; on the other hand, the transfer curve of the organic semiconductor thin film according to Comparative Example 1 after 1 cycle is rapidly changed.

Figure 25:
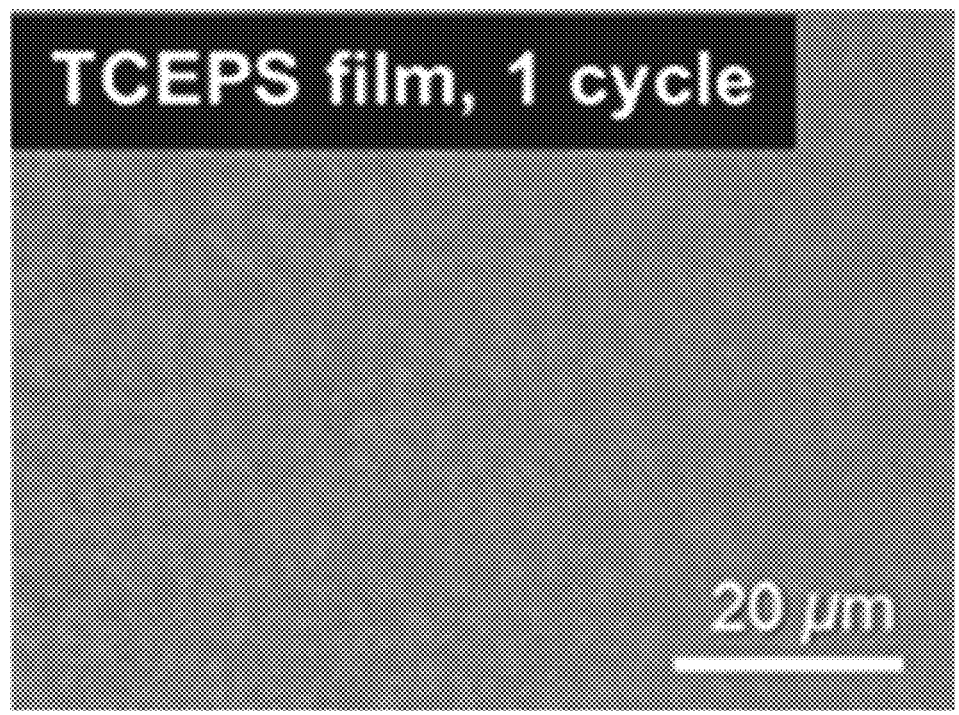
FIG. 25 is an optical microscopic image of an organic semiconductor thin film according to Example 1 (DPPT-TT:SEBS=30:70 wt/wt) after performing under a 100% strain for 1 cycle.
Figure 26:
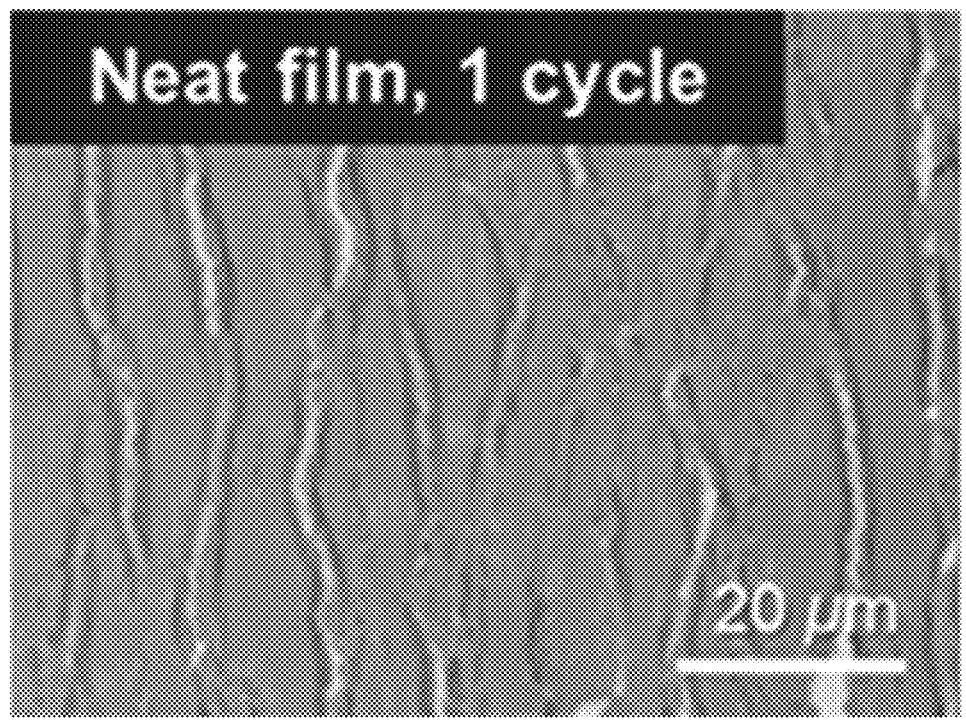
FIG. 26 is an optical microscopic image of an organic semiconductor thin film according to Comparative Example 1 after performing under a 100% strain for 1 cycle.

FIG. 25 is an optical microscopic image after the organic semiconductor thin film according to Example 1 (DPPT-TT:SEBS=30:70 wt/wt) is performed under a 100% strain for 1 cycle; and FIG. 26 is an optical microscopic image after the organic semiconductor thin film according to Comparative Example 1 is performed under a 100% strain for 1 cycle.

Referring to FIGS. 25 and 26, it is confirmed that a crack is not found in the organic semiconductor thin film according to Example 1 (DPPT-TT:SEBS=30:70 wt/wt) (TCEPS film) after performing a 100% strain for 1 cycle; on the other hand, a crack is found in the organic semiconductor thin film according to Comparative Example 1 (Neat film) after performing a 100% strain for 1 cycle.

Figure 27:
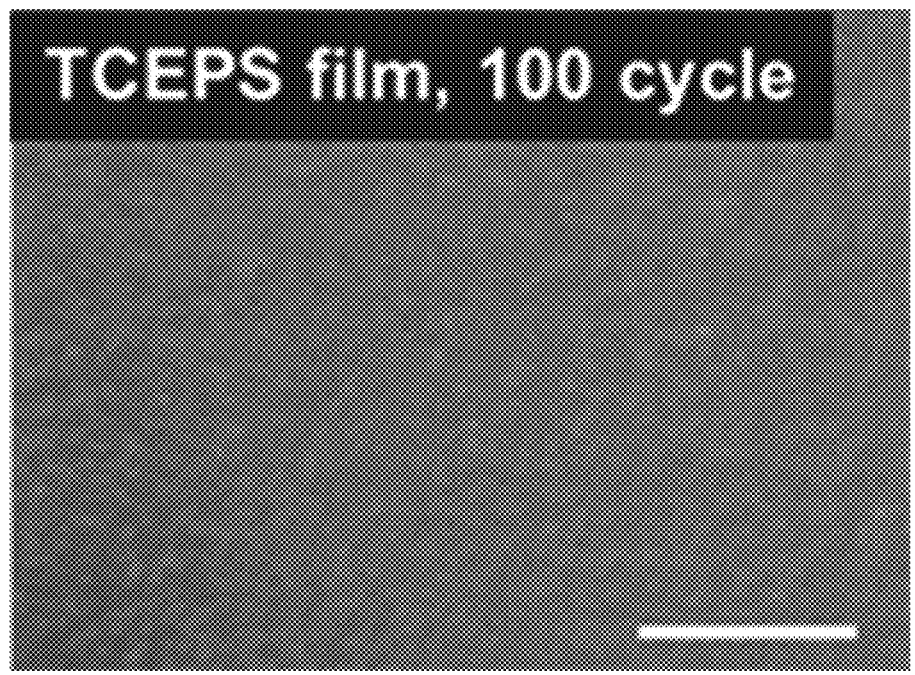
FIG. 27 is an optical microscopic image of an organic semiconductor thin film according to Example 1 (DPPT-TT:SEBS=30:70 wt/wt) after performing under a 100% strain for 100 cycles.
Figure 28:
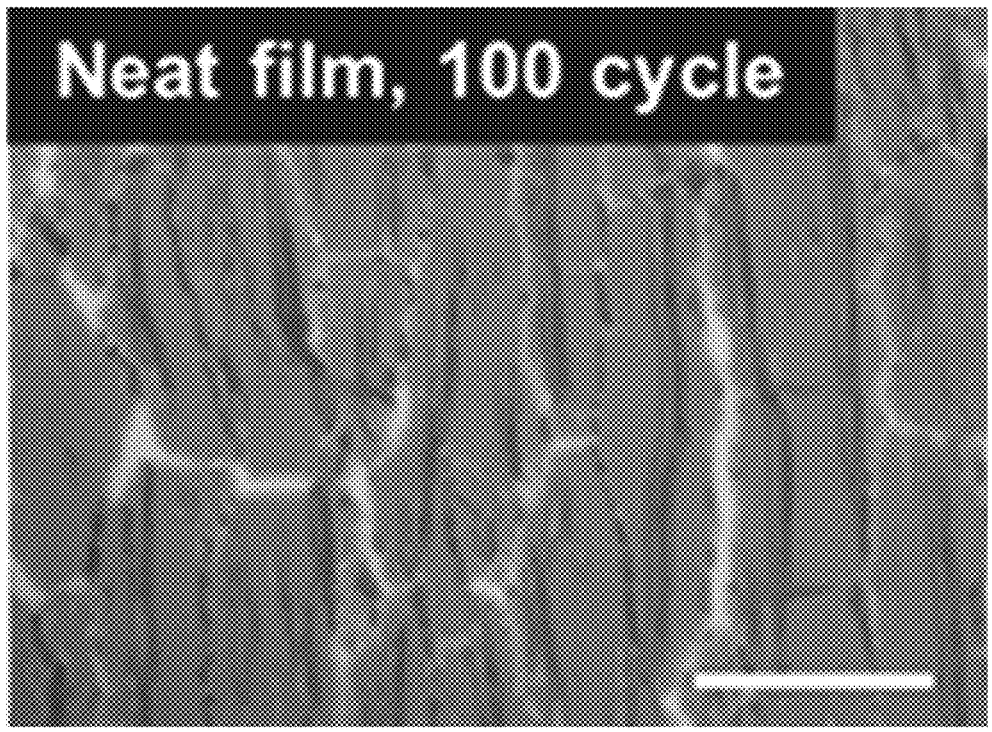
FIG. 28 is an optical microscopic image of an organic semiconductor thin film according to Comparative Example 1 after performing under a 100% strain for 100 cycles.

FIG. 27 is an optical microscopic image of the organic semiconductor thin film according to Example 1 (DPPT-TT:SEBS=30:70 wt/wt) after performing under a 100% strain for 100 cycles; and FIG. 28 is an optical microscopic image of the organic semiconductor thin film according to Comparative Example 1 after performing a 100% strain for 100 cycles.

Referring to FIG. 27, for the organic semiconductor thin film according to Example 1 (DPPT-TT:SEBS=30:70 wt/wt) (TCEPS film), the 100 stretching cycles only slightly increases the film roughness via the formation of small buckles due to plastic deformation. The slight decrease of the mobility may be related to the affected contact to the electrodes with the lamination method. As a comparison, referring to FIG. 28, a lot of cracks are found in the organic semiconductor thin film according to Comparative Example 1 (Neat film) after performing under a 100% strain for 100 cycles.

Figure 29:
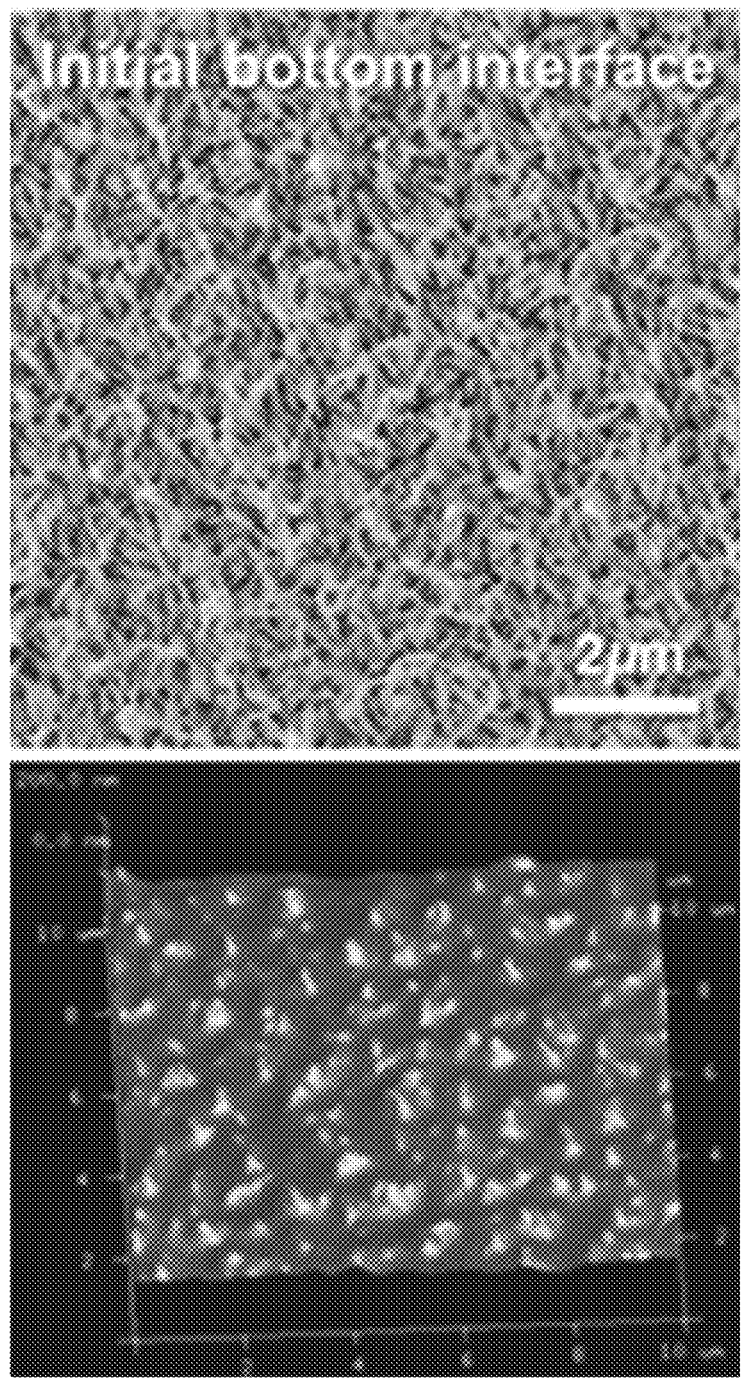
FIG. 29 shows FM images of a lower surface layer at the initial stage before stretching an organic semiconductor thin film according to Example 1 (DPPT-TT:SEBS=30:70 wt/wt).
Figure 30:
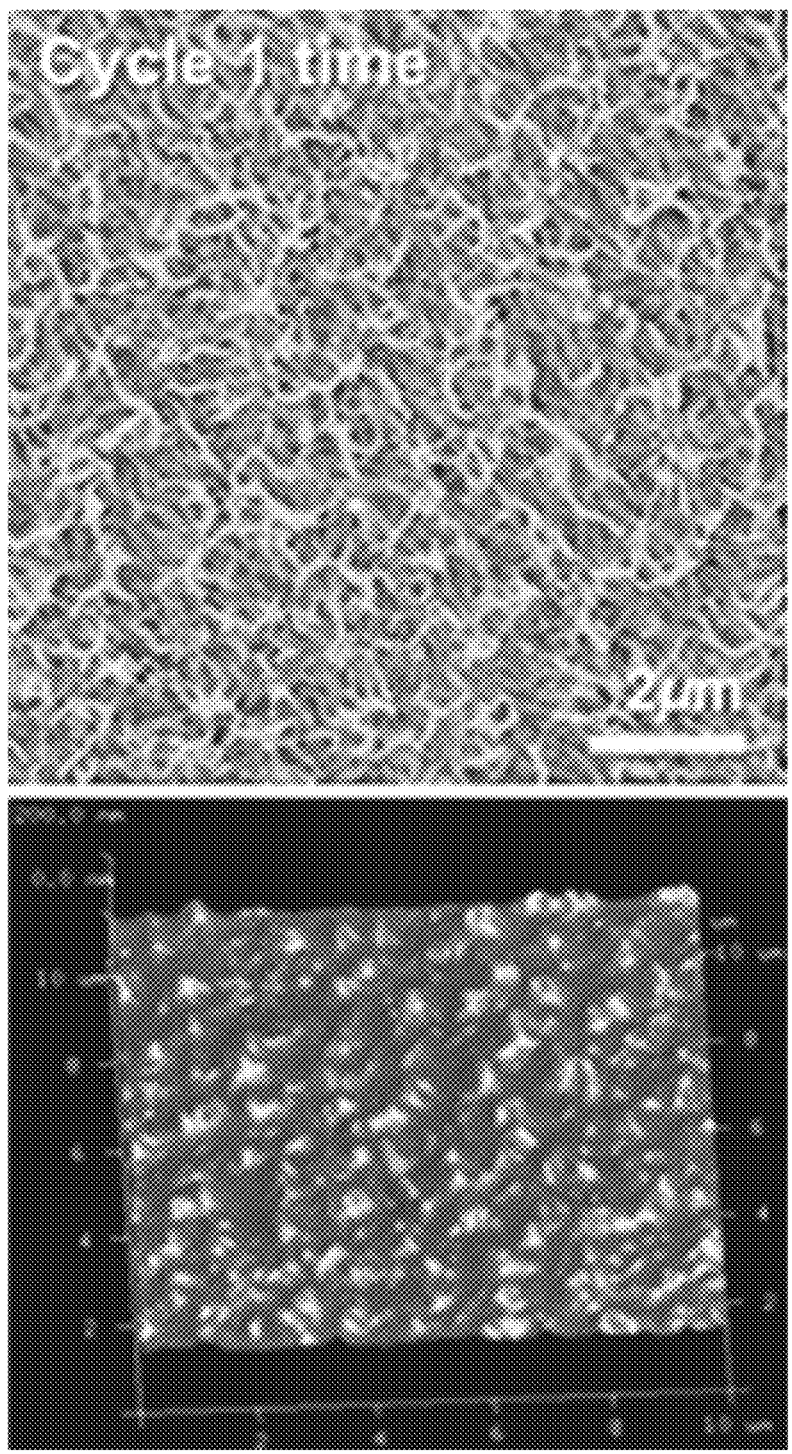
FIG. 30 shows AFM phase images of a lower surface layer after an organic semiconductor thin film according to Example 1 (DPPT-TT:SEBS=30:70 wt/wt) is performed under a 100% strain for 1 cycle.

FIG. 29 shows AFM phase images of a lower surface layer at an initial stage before stretching the organic semiconductor thin film according to Example 1 (DPPT-TT:SEBS=30:70 wt/wt); FIG. 30 shows AFM phase images of a lower surface layer of the organic semiconductor thin film according to Example 1 (DPPT-TT:SEBS=30:70 wt/wt) after performing under a 100% strain for 1 cycle; and FIG. 31 shows AFM phase images of a lower surface layer of the organic semiconductor thin film according to Example 1 (DPPT-TT:SEBS=30:70 wt/wt) after performing under a 100% strain for 100 cycles.

Figure 31:
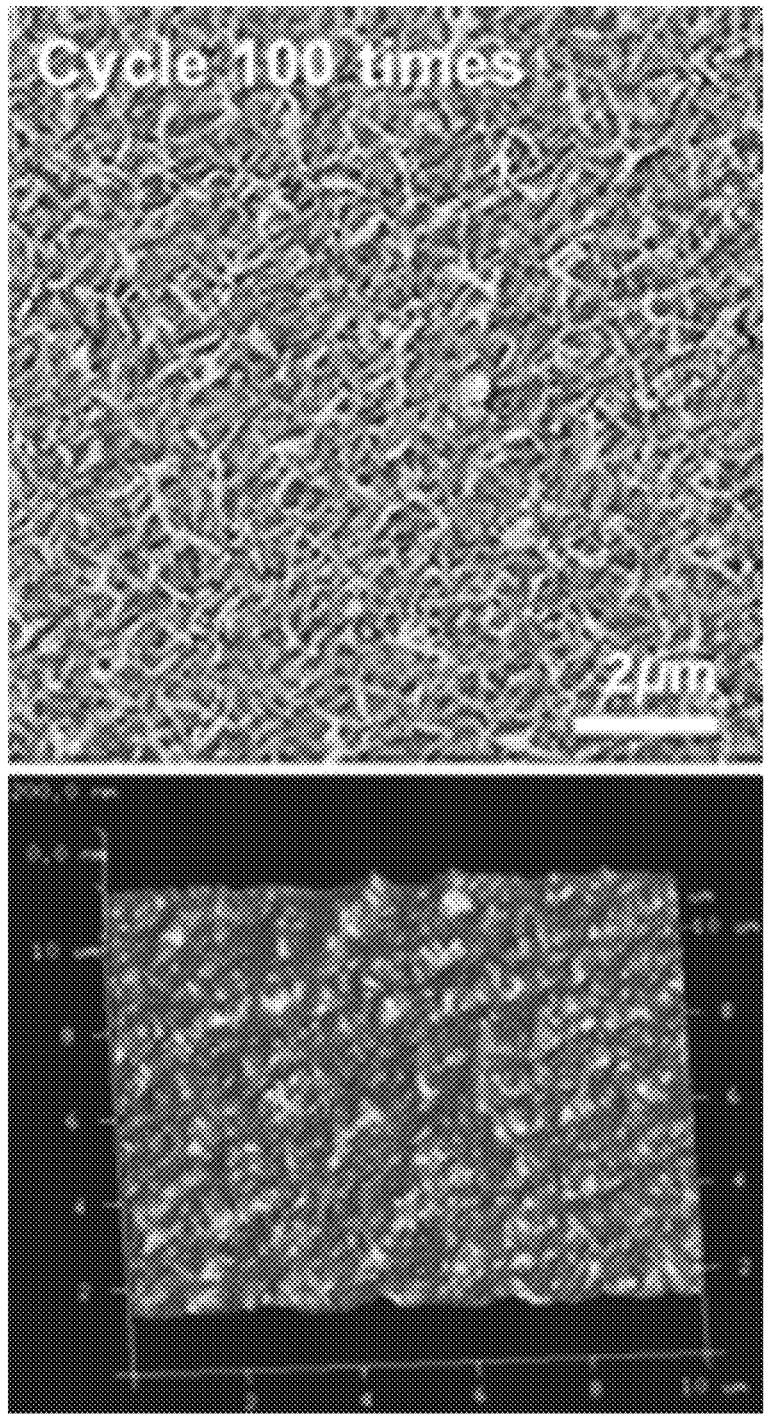
FIG. 31 shows AFM phase images of a lower surface layer after an organic semiconductor thin film according to Example 1 (DPPT-TT:SEBS=30:70 wt/wt) is performed under a 100% strain for 100 cycles.
Figure 32:
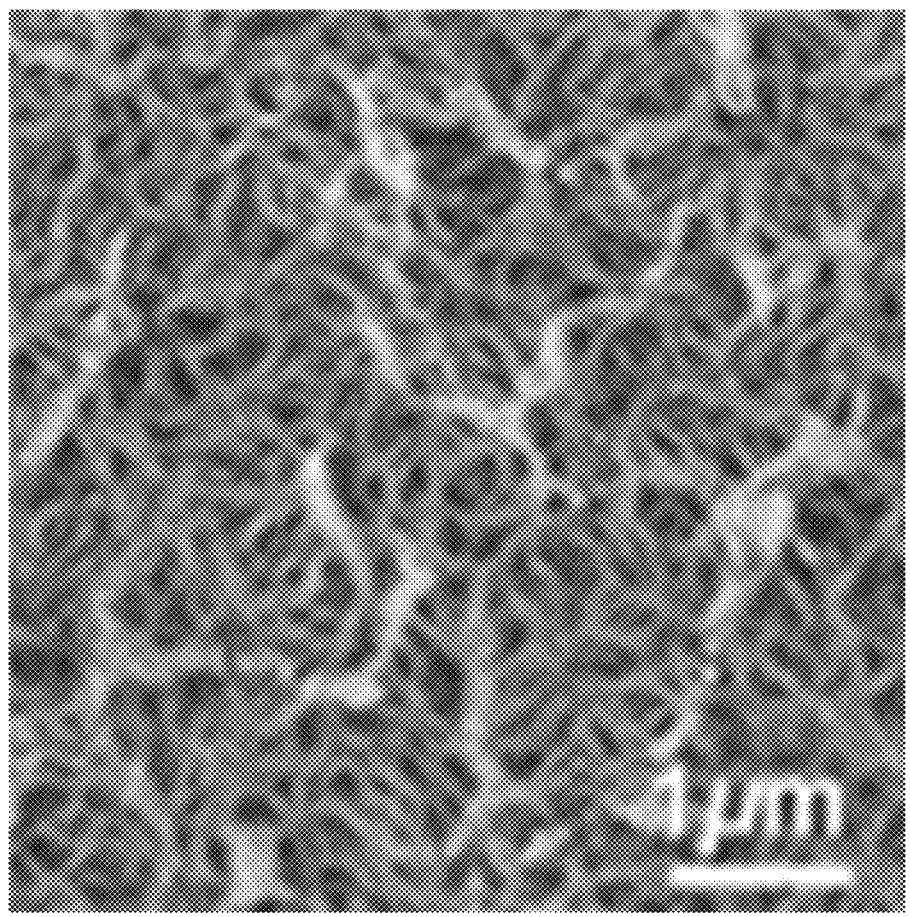
FIGS. 32 to 35 are AFM phase images showing lower surface layers of organic semiconductor thin films according to Examples 2 to 5, respectively.
Figure 33:
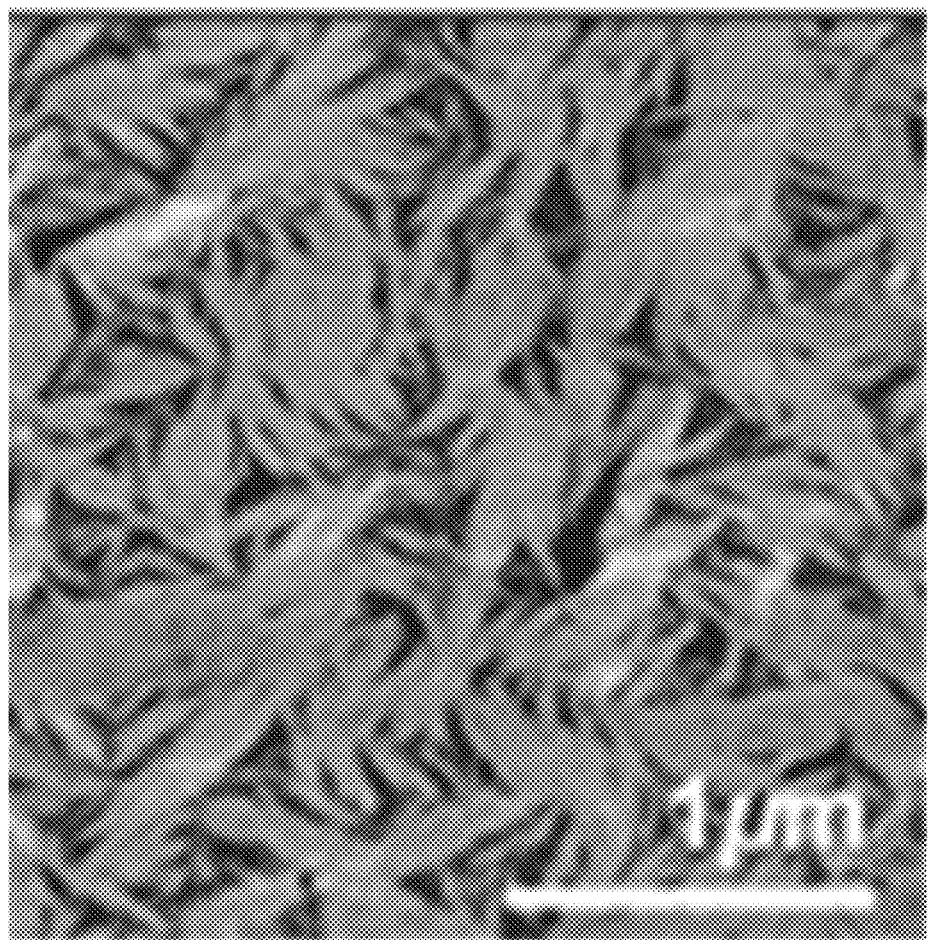
Figure 34:
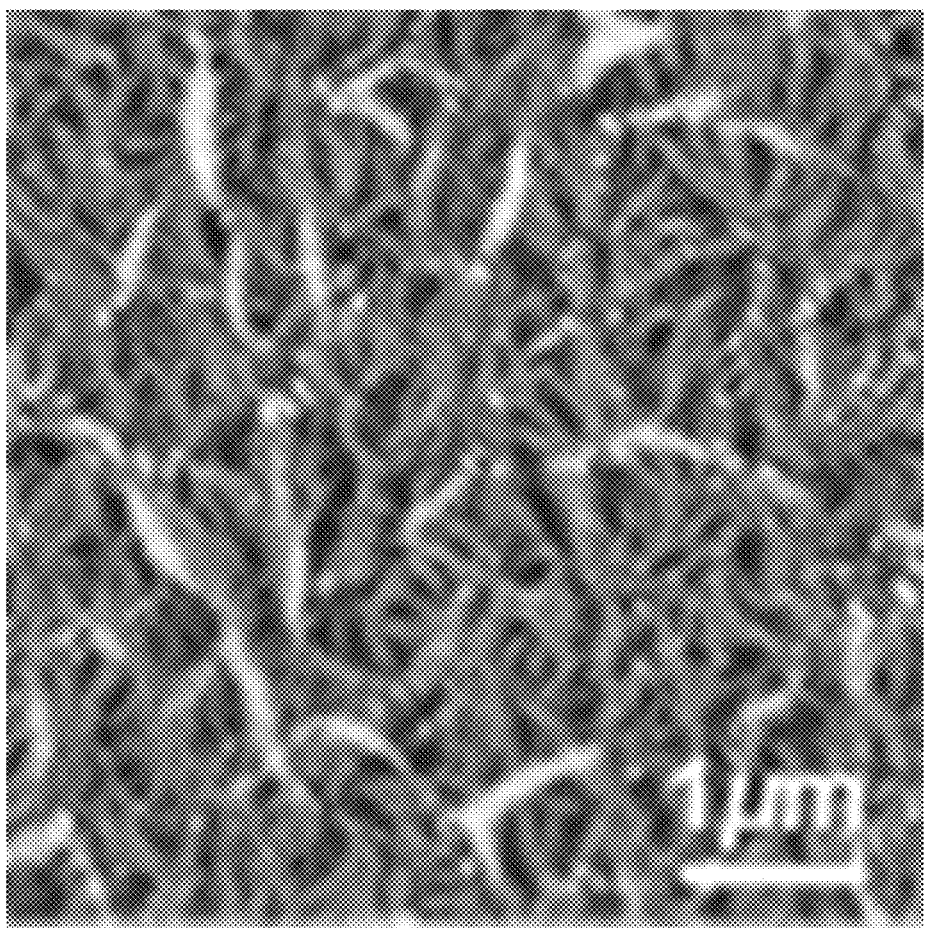
Figure 35:
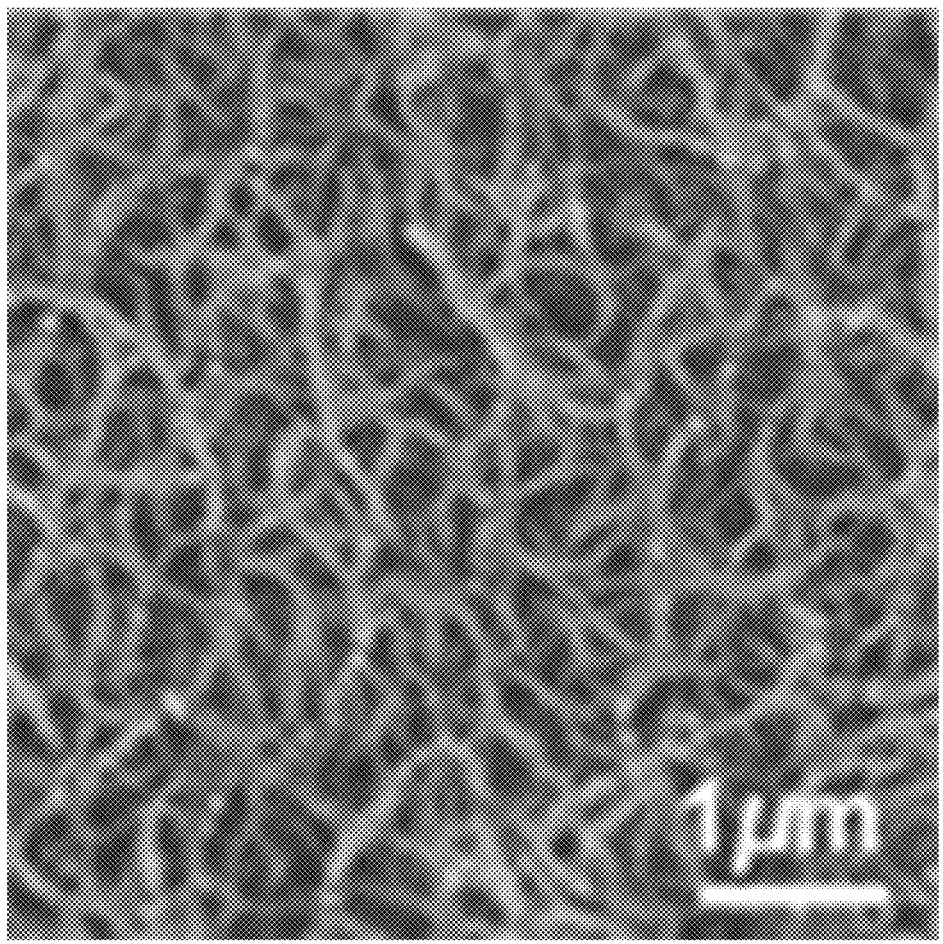

Referring to FIGS. 29 to 31, it is confirmed that the surface morphology of the organic semiconductor thin film according to Example 1 (DPPT-TT:SEBS=30:70 wt/wt) is maintained as in the initial stage, even after performing under a 100% strain for 100 cycles.

Examples 2 to 5

Benefited from the general existence of the nanoconfinement effect in many different polymer systems, this concept for largely improving the stretchability of polymer semiconductor films should be broadly applicable to various conjugated polymers. As a demonstration for this, we further apply in the same way as Example 1 to several other semiconducting polymers. The organic semiconductor thin films are prepared in accordance with the same procedures as in Example 1 (polymer:elastomer=30:70 wt/wt), except that P-29-DPPDTSE, PffBT4T-2DT, P (DPP2TTVT) and PTDPPTFT4 are used instead of DPPT-TT as a conjugation semiconductor polymer, respectively.

Comparative Examples 2 to 5

The organic semiconductor thin films including only P-29-DPPDTSE, PffBT4T-2DT, P (DPP2TTVT) and PTDPPTFT4 with no elastomer are prepared, respectively.

Evaluation 8

The organic semiconductor thin films according to Examples 2 to 5 are monitored for a morphology.

FIGS. 32 to 35 show AFM phase images of lower surface layers of organic semiconductor thin films according to Examples 2 to 5, respectively.

Referring to FIGS. 32 to 35, it is confirmed that a nanoconfined polymer network is effectively formed in the organic semiconductor thin films according to Examples 2 to 5.

Evaluation 9

The organic semiconductor thin films according to Examples 2 to 5 and Comparative Examples 2 to 5 are evaluated for whether a crack is generated after stretching under a 100% strain.

Figure 36:
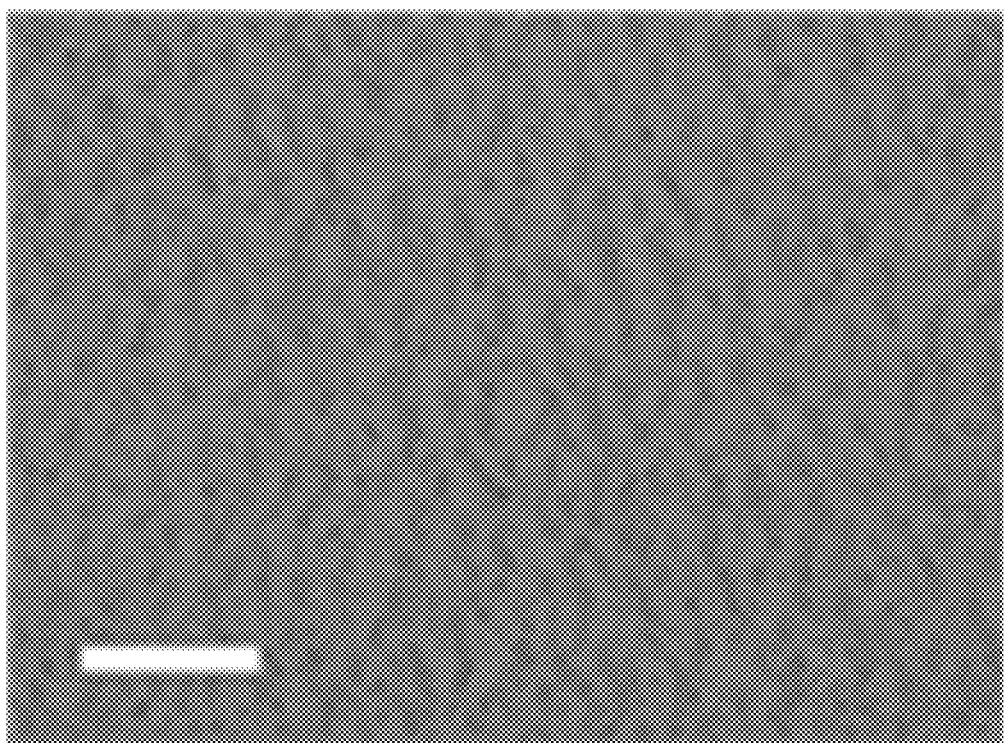
FIGS. 36 and 37 are optical microscopic images after organic semiconductor thin films according to Example 2 and Comparative Example 2 are stretched under a 100% strain, respectively.
Figure 37:
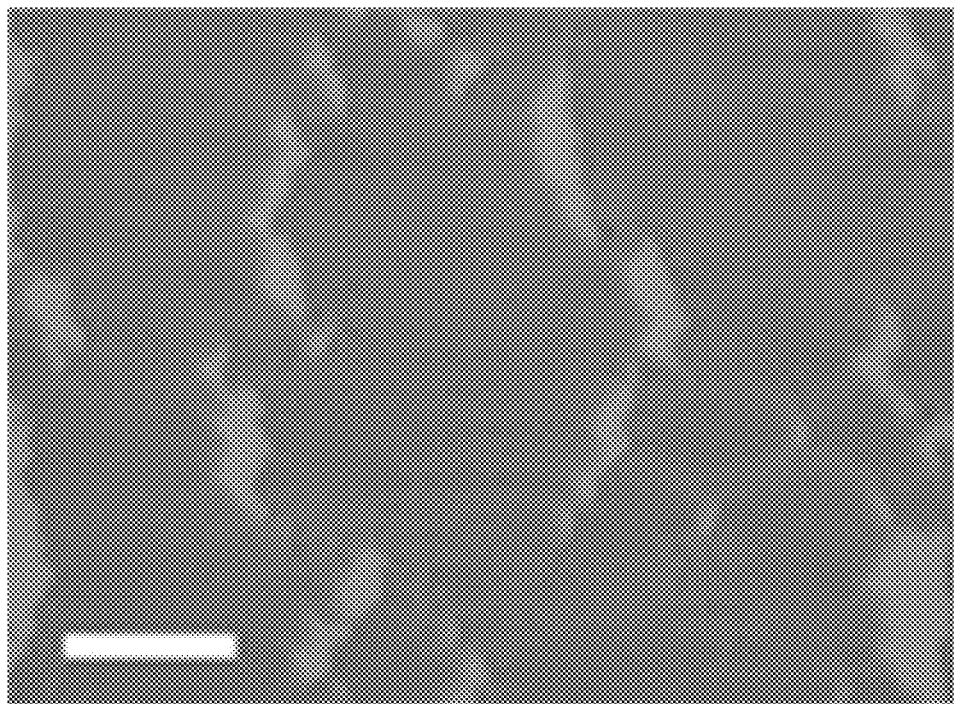
Figure 38:
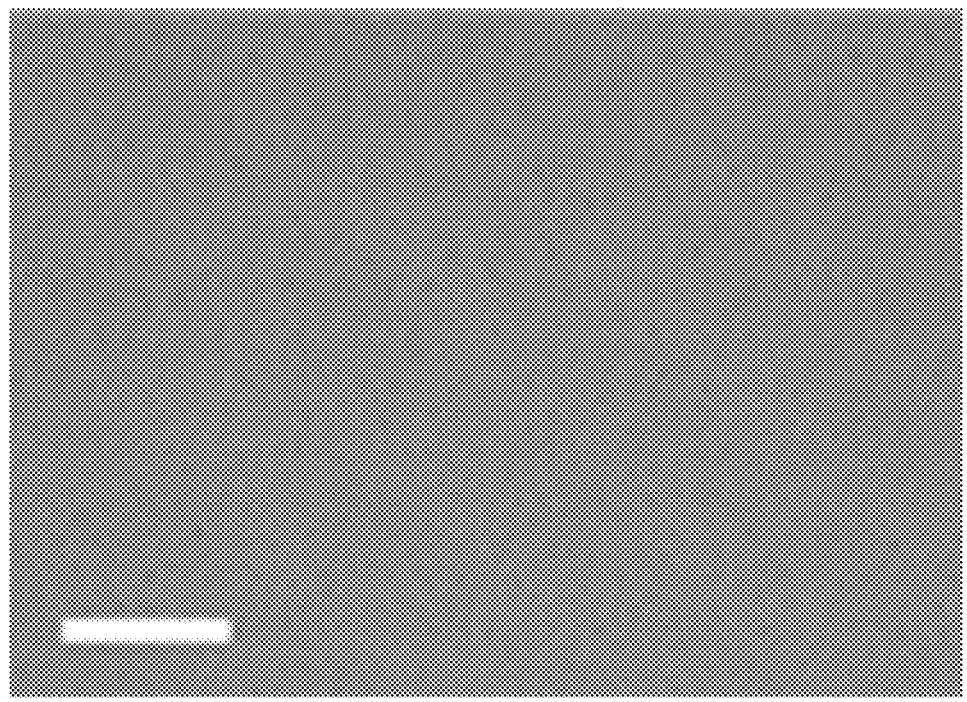
FIGS. 38 and 39 are optical microscopic images after organic semiconductor thin films according to Example 3 and Comparative Example 3 are stretched at 100% strain, respectively.
Figure 39:
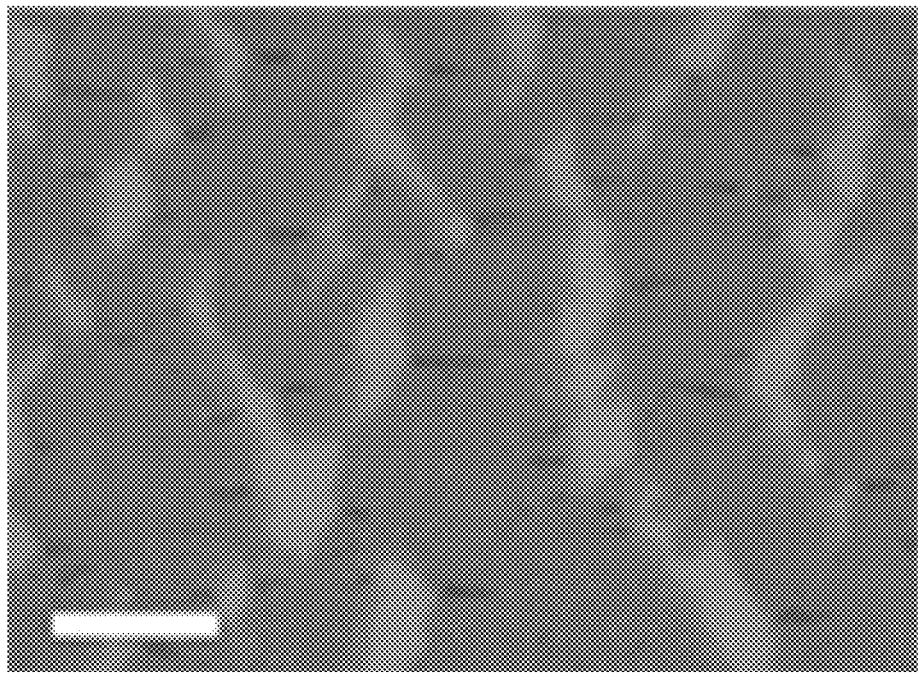
Figure 40:
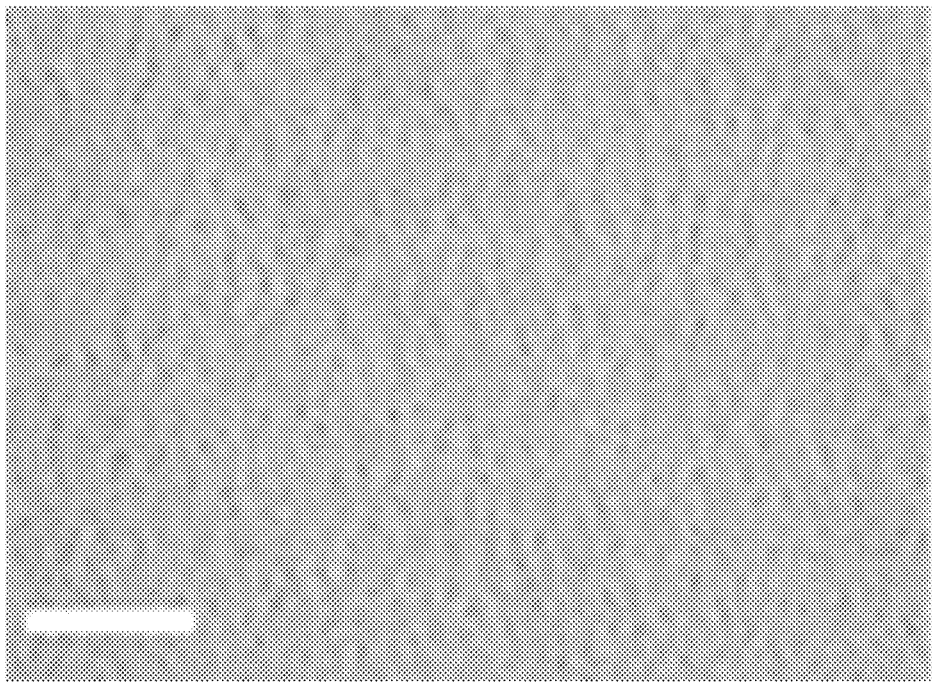
FIGS. 40 and 41 are optical microscopic images after organic semiconductor thin films according to Example 4 and Comparative Example 4 are stretched at 100% strain, respectively.
Figure 41:
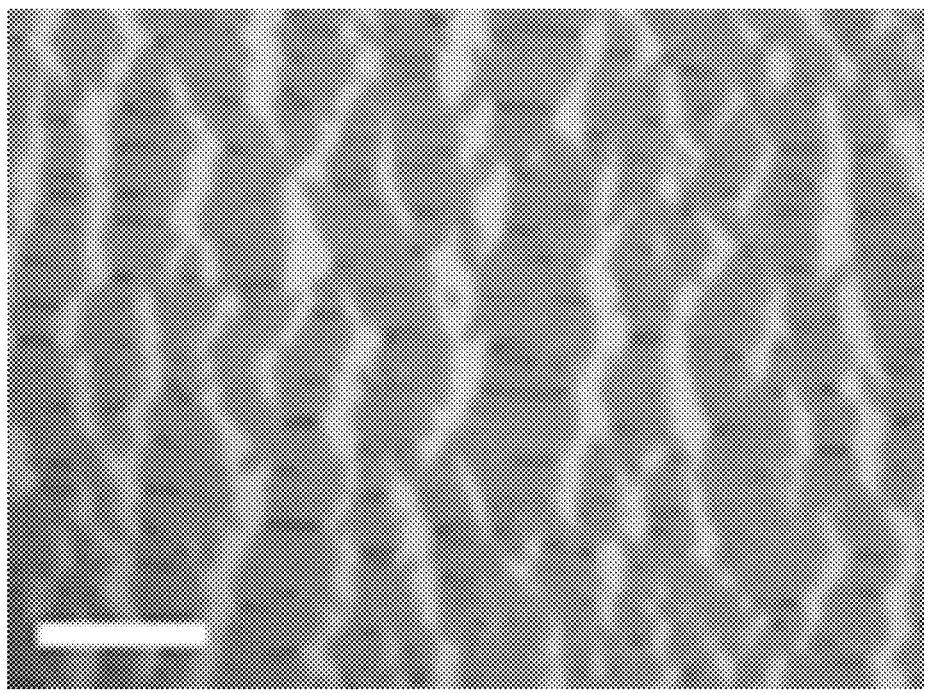
Figure 42:
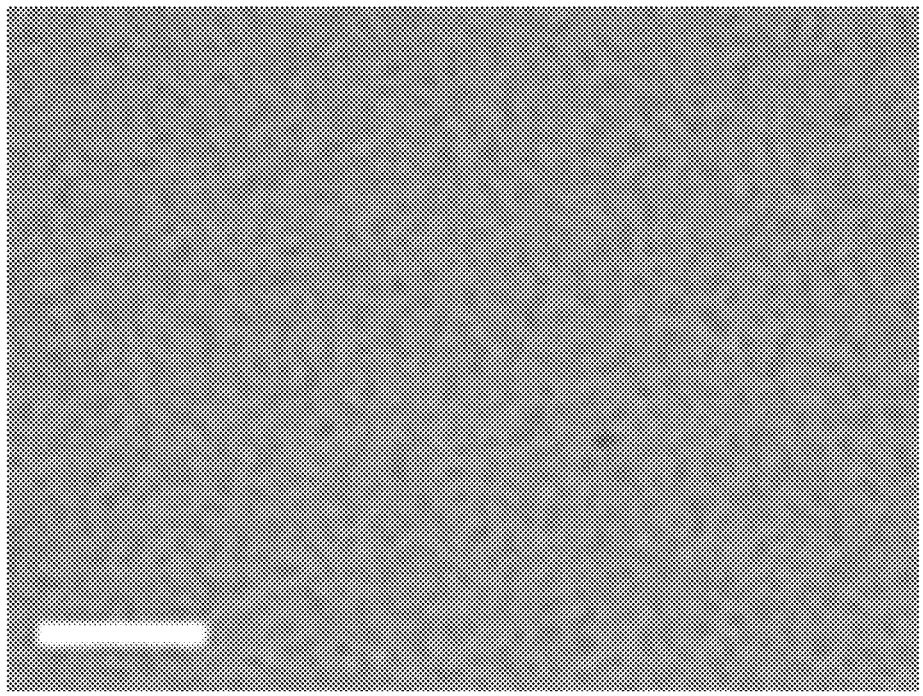
FIGS. 42 and 43 are optical microscopic images after organic semiconductor thin films according to Example 5 and Comparative Example 5 are stretched at 100% strain, respectively.
Figure 43:
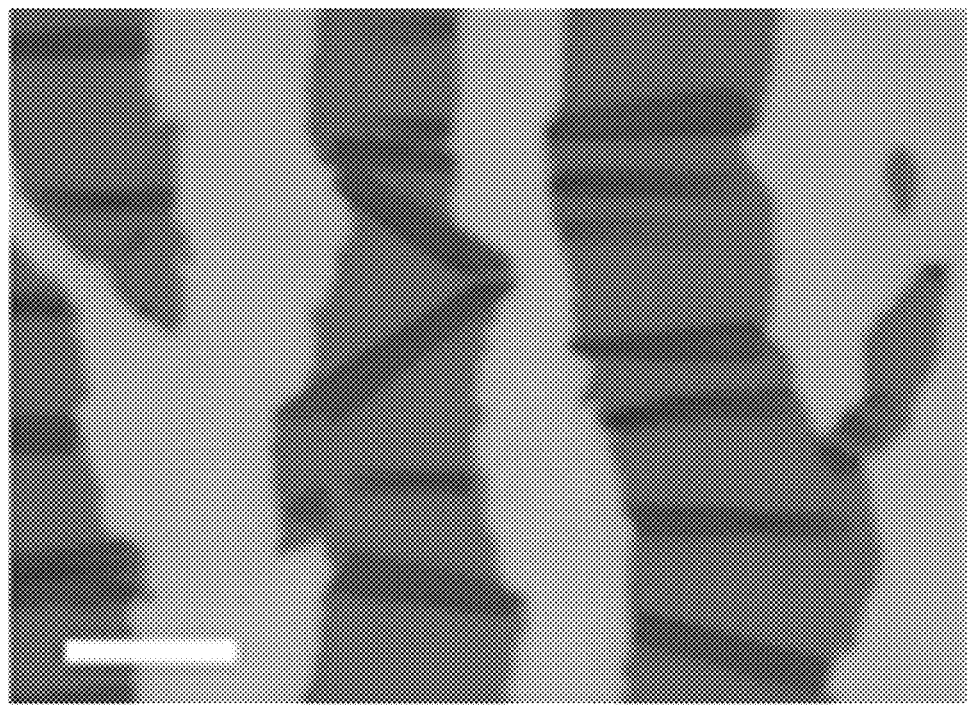

FIGS. 36 and 37 are optical microscopic images of the organic semiconductor thin films according to Example 2 and Comparative Example 2, respectively, after stretching under a 100% strain; FIGS. 38 and 39 are optical microscopic images of the organic semiconductor thin films according to Example 3 and Comparative Example 3, respectively, after stretching under a 100% strain; FIGS. 40 and 41 are optical microscopic images of the organic semiconductor thin films according to Example 4 and Comparative Example 4, respectively, after stretching under a 100% strain; and FIGS. 42 and 43 are optical microscopic images of the organic semiconductor thin films according to Example 5 and Comparative Example 5, respectively, after stretching under a 100% strain.

Referring to FIGS. 36 to 43, while the organic semiconductor thin films according to Comparative Example 2 to 5 crack severely after stretching under 100% strain, the organic semiconductor thin films according to Example 2 to 5 have no crack after stretching under 100% strain.

Evaluation 10

The electrical characteristics of the organic semiconductor thin films according to Examples 2 to 5 after stretching under a 100% strain are compared to those according to Comparative Examples 2 to 5.

Figure 44:
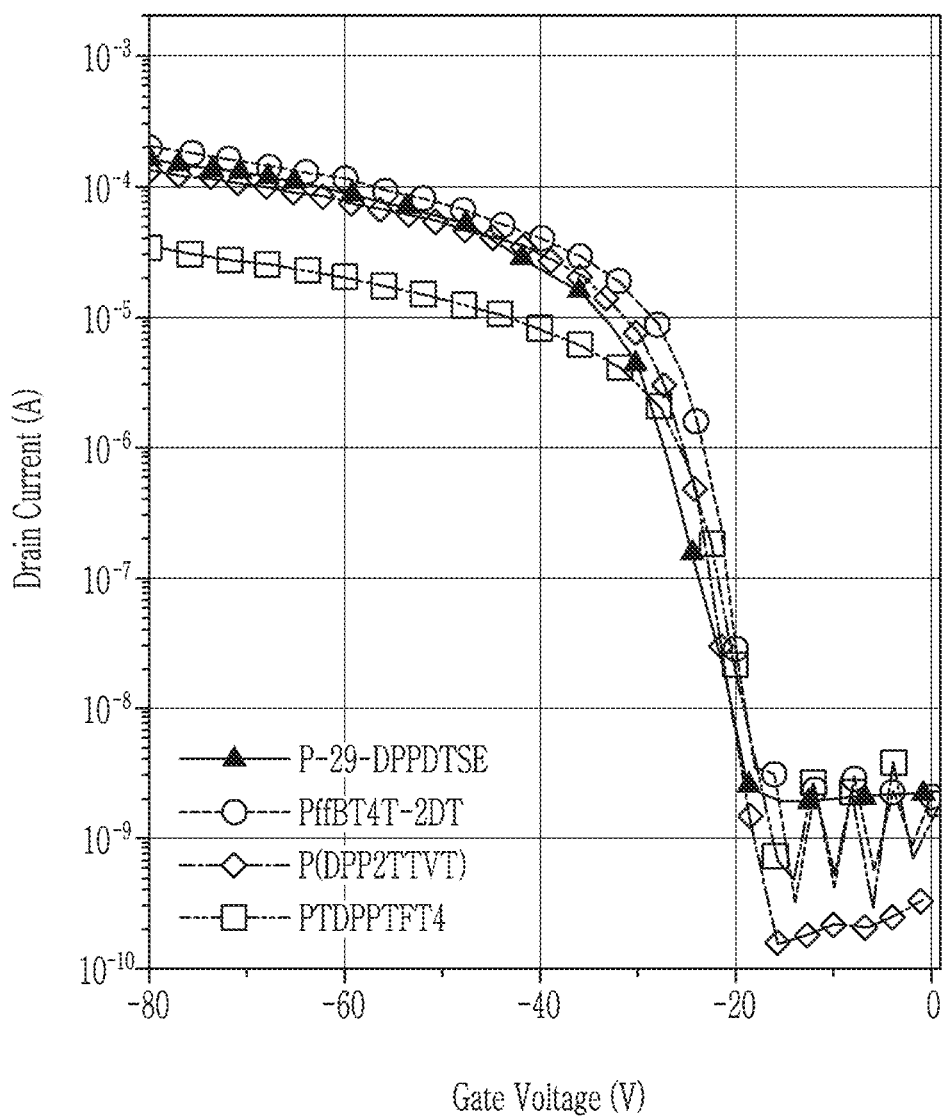
FIGS. 44 and 45 are graphs showing current characteristics of thin film transistors including the organic semiconductor thin films according to Examples 2 to 5 and Comparative Examples 2 to 5 after they are stretched at a 100% strain.
Figure 45:
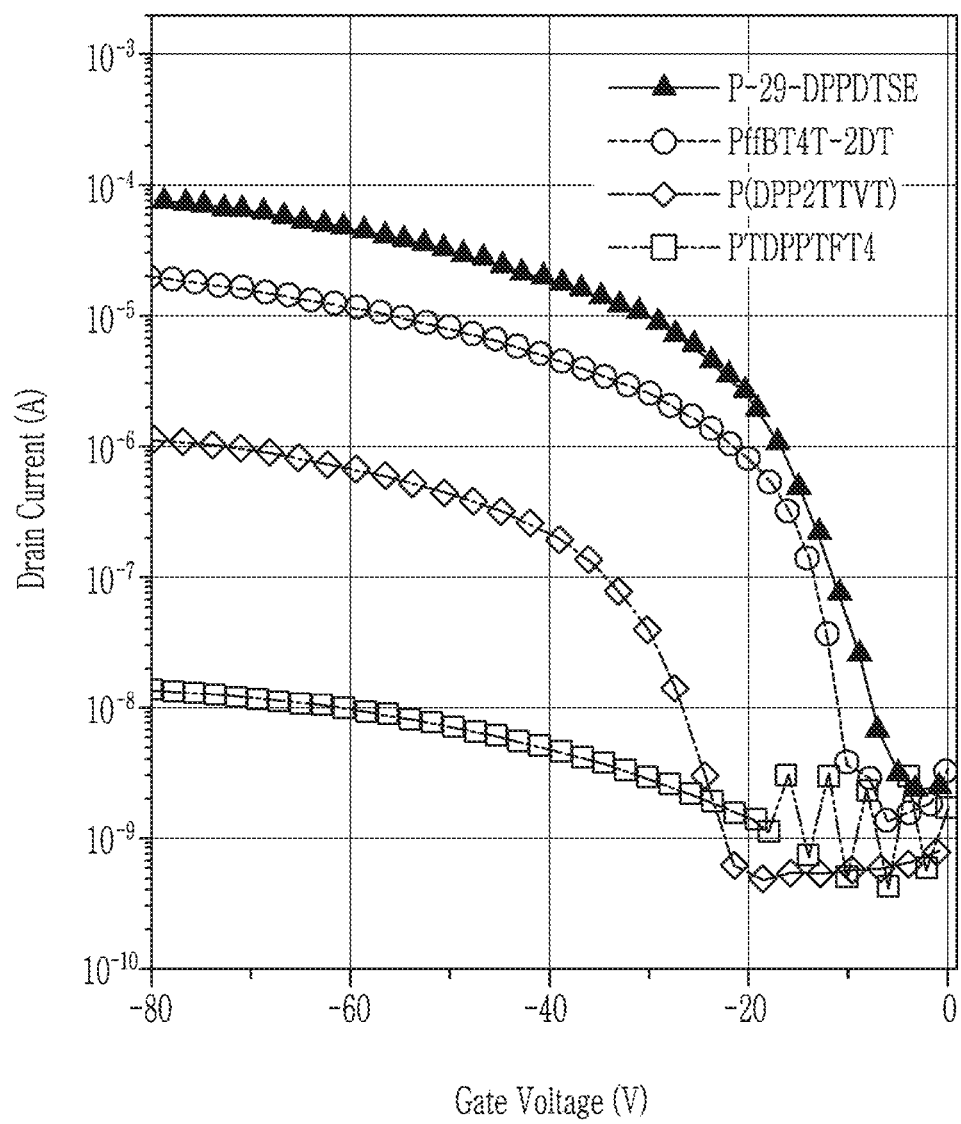
Figure 46:
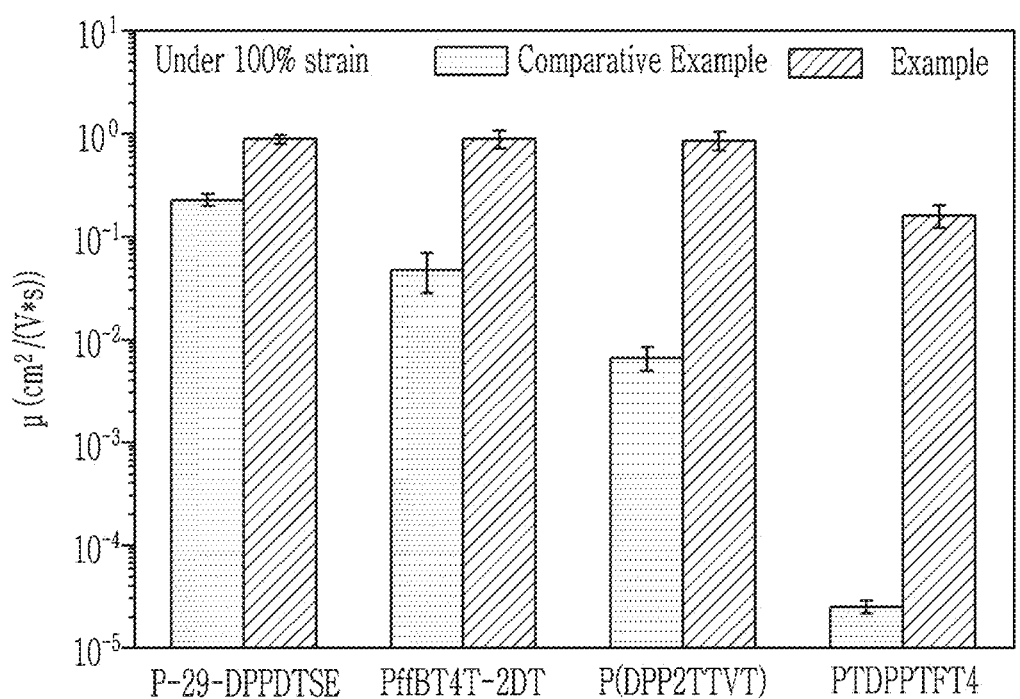
FIG. 46 is a graph showing a charge mobility after each organic semiconductor thin film according to Examples 2 to 5 and Comparative Examples 2 to 5 is stretched under a 100% strain.

FIGS. 44 and 45 are graphs showing current characteristics of TFTS including the organic semiconductor thin films according to Examples 2 to 5 and Comparative Examples 2 to 5 after stretching under a 100% strain; and FIG. 46 is a graph showing a charge mobility of TFTS including the organic semiconductor thin films according to Examples 2 to 5 and Comparative Examples 2 to 5 after stretching under a 100% strain.

Referring to FIGS. 44 to 46, it is confirmed that the current characteristics and the charge mobility are improved in the organic semiconductor thin films according to Examples 2 to 5 after stretching under a 100% strain, compared to those of the organic semiconductor thin films according to Comparative Examples 2 to 5.

While some example embodiments have been described, the present disclosure should be considered in a descriptive sense, not for purposes of limitation. Features and/or aspects within each device or method according to example embodiments generally should be considered as available for other similar features or aspects in other devices according to example embodiments. It is to be understood that variations in form and details may be made without departing from the spirit and scope of the claims.

What is claimed is:

1. An organic semiconductor thin film, comprising
   a matrix including an elastomer and nanoconfined polymer structures embedded in the matrix,
   the nanoconfined polymer structures forming a polymer network,
   the nanoconfined polymer structures including a conjugation semiconductor polymer,
   the conjugation semiconductor polymer including a repeating unit having at least one conjugation system in its main chain, the nanoconfined polymer structures being present in an upper surface layer and a lower surface layer of the organic semiconductor thin film respectively, the nanoconfined polymer structures are distributed in a different amount in a thickness direction of the organic semiconductor thin film, the nanoconfined polymer structures are mainly distributed in an upper surface layer and a lower surface layer of the organic semiconductor thin film, and the conjugation system includes at least one moiety represented by one of Chemical Formulae 1-1 to 1-10:

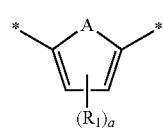
[Chemical Formula 1-1]

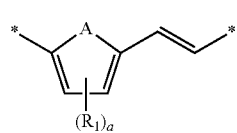
[Chemical Formula 1-2]

wherein, in Chemical Formula 1-1 or 1-2, A is O, S, Se, or NH, $R_1$ is a substituted or unsubstituted C1 to C40 aliphatic hydrocarbon group, a substituted or unsubstituted C6 to C30 aromatic hydrocarbon group, or a halogen, a is an integer ranging from 0 to 2, and * is a linking point with an adjacent moiety,

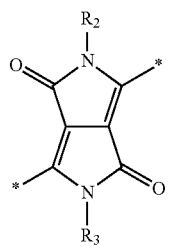
[Chemical Formula 1-3]

wherein, in Chemical Formula 1-3, $R_2$ and $R_3$ are independently hydrogen, a substituted or unsubstituted C1 to C40 aliphatic hydrocarbon group or a substituted or unsubstituted C6 to C30 aromatic hydrocarbon group, and * is a linking point with an adjacent moiety,

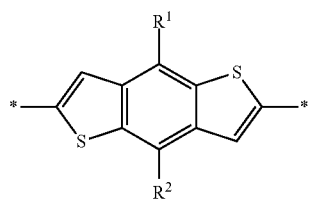
[Chemical Formula 1-4]

wherein, in Chemical Formula 1-4, $R^1$ and $R^2$ are independently hydrogen, a substituted or unsubstituted C1 to C40 aliphatic hydrocarbon group or a substituted or unsubstituted C6 to C30 aromatic hydrocarbon group, and * is a linking point with an adjacent moiety,

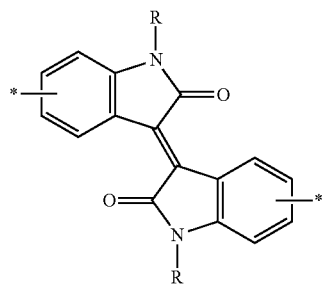
[Chemical Formula 1-5]

wherein, in Chemical Formula 1-5, R is independently hydrogen, a substituted or unsubstituted C1 to C40 aliphatic hydrocarbon group or a substituted or unsubstituted C6 to C30 aromatic hydrocarbon group, and * is a linking point with an adjacent moiety,

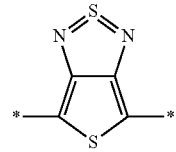
[Chemical Formula 1-6]

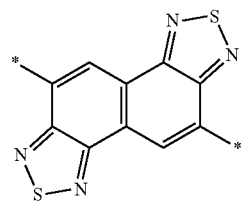
[Chemical Formula 1-7]

wherein, in Chemical Formula 1-6 or 1-7, * is a linking point with an adjacent moiety,

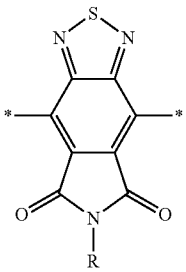
[Chemical Formula 1-8]

wherein, in Chemical Formula 1-8, R is hydrogen, a substituted or unsubstituted C1 to C40 aliphatic hydrocarbon group or a substituted or unsubstituted C6 to C30 aromatic hydrocarbon group, and * is a linking point with an adjacent moiety,

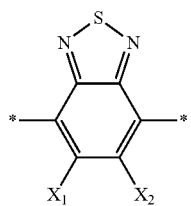

[Chemical Formula 1-9]

wherein, in Chemical Formula 1-9, $X_1$ and $X_2$ are independently halogen and * is a linking point with an adjacent moiety, and

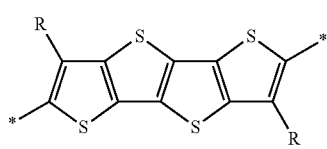

[Chemical Formula 1-10]

wherein, in Chemical Formula 1-10, R's are independently hydrogen, a substituted or unsubstituted C1 to C40 aliphatic hydrocarbon group or a substituted or unsubstituted C6 to C30 aromatic hydrocarbon group, and * is a linking point with an adjacent moiety.

2. The organic semiconductor thin film of claim 1, wherein the nanoconfined polymer structure is a nanofibril having a continuous pathway.

3. The organic semiconductor thin film of claim 2, wherein the nanofibril has a diameter of less than or equal to about 50 nm.

4. The organic semiconductor thin film of claim 1, wherein the nanoconfined polymer structures includes aggregations of the conjugation semiconductor polymer.

5. The organic semiconductor thin film of claim 1, wherein the polymer network includes a web-like nanofibril semiconducting polymer.

6. The organic semiconductor thin film of claim 1, wherein the elastomer and the conjugation semiconductor polymer are phase separated.

7. The organic semiconductor thin film of claim 1, wherein the conjugation semiconductor polymer and the elastomer are included in a weight ratio of about 70:30 to about 5:95.

8. The organic semiconductor thin film of claim 1, wherein the conjugation semiconductor polymer and the elastomer are included in a weight ratio of about 50:50 to about 10:90.

9. The organic semiconductor thin film of claim 1, wherein the elastomer includes an elastic rubber.

10. The organic semiconductor thin film of claim 1, wherein the elastomer includes one of polybutadiene (PB), a styrene-butadiene copolymer (SB), a styrene-butadiene-styrene copolymer (SBS), a styrene-ethylene-butylene-styrene copolymer (SEBS), an ethylene propylene diene rubber (EPDR), an acrylic rubber, a polychloroprene rubber, polyurethane, a fluoro-rubber, a butyl rubber, a silicone rubber, and a combination thereof.

11. The organic semiconductor thin film of claim 1, wherein the conjugation semiconductor polymer is a donor-acceptor type polymer having an electron donating moiety and an electron accepting moiety.

12. The organic semiconductor thin film of claim 1, wherein the conjugation system further includes one of a substituted or unsubstituted phenylene group, a substituted or unsubstituted thiazoline group, a substituted or unsubstituted pyridine group, a substituted or unsubstituted naphthalene group, a substituted or unsubstituted anthracene group, a substituted or unsubstituted naphtacene group, a substituted or unsubstituted fluorene group, a substituted or unsubstituted carbazole group, a substituted or unsubstituted thienothiophene group, a substituted or unsubstituted thieno benzothiophene group, and a combination thereof.

13. The organic semiconductor thin film of claim 1, wherein the organic semiconductor thin film is a stretchable thin film.

14. A thin film transistor comprising
a gate electrode,
a semiconductor layer including the organic semiconductor thin film of claim 1,
a gate insulating layer between the gate electrode and the semiconductor layer, and
a source electrode and a drain electrode electrically connected to the semiconductor layer.

15. An electronic device comprising: the thin film transistor of claim 14.

16. An electronic device comprising: the organic semiconductor thin film of claim 1.

17. An organic semiconductor thin film, comprising
an elastomer including a first region, a second region, and a third region, the second region being between the first region and the third region; and
a plurality of nanoconfined polymer structures,
  the nanoconfined polymer structures including a conjugation semiconductor polymer,
  the conjugation semiconductor polymer including a repeating unit having at least one conjugation system in its main chain, and
  the nanoconfined polymer structures forming a first polymer network in the first region of the elastomer and a second polymer network in the third region of the elastomer, wherein
the nanoconfined polymer structures are distributed in a different amount in a thickness direction of the organic semiconductor thin film,
the nanoconfined polymer structures are mainly distributed in an upper surface layer and a lower surface layer of the organic semiconductor thin film, and
the conjugation system includes at least one moiety represented by one of Chemical Formulae 1-1 to 1-10:

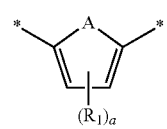

[Chemical Formula 1-1]

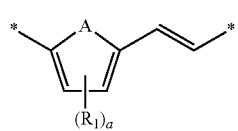

[Chemical Formula 1-2]

wherein, in Chemical Formula 1-1 or 1-2, A is O, S, Se, or NH, $R_1$ is a substituted or unsubstituted C1 to C40 aliphatic hydrocarbon group, a substituted or unsubstituted C6 to C30 aromatic hydrocarbon group, or a halogen, a is an integer ranging from 0 to 2, and * is a linking point with an adjacent moiety,

[Chemical Formula 1-3]

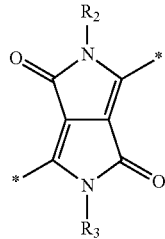

wherein, in Chemical Formula 1-3, R₂ and R₃ are independently hydrogen, a substituted or unsubstituted C1 to C40 aliphatic hydrocarbon group or a substituted or unsubstituted C6 to C30 aromatic hydrocarbon group, and * is a linking point with an adjacent moiety,

[Chemical Formula 1-4]

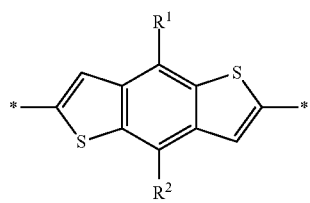

wherein, in Chemical Formula 1-4, $R^1$ and $R^2$ are independently hydrogen, a substituted or unsubstituted C1 to C40 aliphatic hydrocarbon group or a substituted or unsubstituted C6 to C30 aromatic hydrocarbon group, and * is a linking point with an adjacent moiety,

[Chemical Formula 1-5]

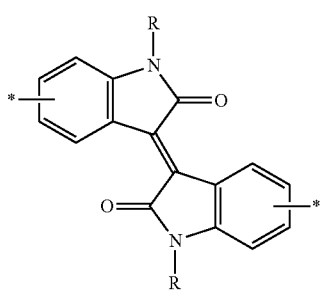

wherein, in Chemical Formula 1-5, R is independently hydrogen, a substituted or unsubstituted C1 to C40 aliphatic hydrocarbon group or a substituted or unsubstituted C6 to C30 aromatic hydrocarbon group, and * is a linking point with an adjacent moiety,

[Chemical Formula 1-6]

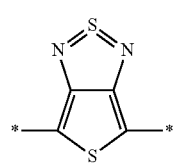

-continued

[Chemical Formula 1-7]

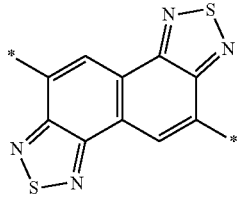

wherein, in Chemical Formula 1-6 or 1-7, * is a linking point with an adjacent moiety,

[Chemical Formula 1-8]

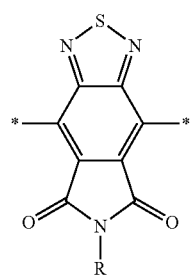

wherein, in Chemical Formula 1-8, R is hydrogen, a substituted or unsubstituted C1 to C40 aliphatic hydrocarbon group or a substituted or unsubstituted C6 to C30 aromatic hydrocarbon group, and * is a linking point with an adjacent moiety,

[Chemical Formula 1-9]

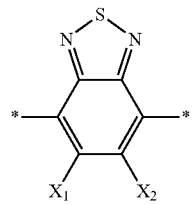

wherein, in Chemical Formula 1-9, $X_1$ and $X_2$ are independently halogen and * is a linking point with an adjacent moiety, and

[Chemical Formula 1-10]

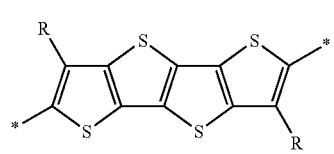

wherein, in Chemical Formula 1-10, R's are independently hydrogen, a substituted or unsubstituted C1 to C40 aliphatic hydrocarbon group or a substituted or unsubstituted C6 to C30 aromatic hydrocarbon group, and * is a linking point with an adjacent moiety.

18. The organic semiconductor thin film of claim 17, wherein
the conjugation semiconductor polymer and the elastomer are included in a weight ratio of about 70:30 to about 5:95, and the elastomer includes one of polybutadiene (PB), a styrene-butadiene copolymer (SB), a styrene-butadiene-styrene copolymer (SBS), a styrene-ethylene-butylene-styrene copolymer (SEBS), an ethylene propylene diene rubber (EPDR), an acrylic rubber, a polychloroprene rubber, polyurethane, a fluoro-rubber, a butyl rubber, a silicone rubber, and a combination thereof.

19. The organic semiconductor thin film of claim 17, wherein
the nanoconfined polymer structures include a nanofibril, and
the nanofibril has a diameter of less than or equal to about 50 nm.

20. A thin film transistor comprising
a gate electrode,
a semiconductor layer including the organic semiconductor thin film of claim 17,
a gate insulating layer between the gate electrode and the semiconductor layer, and
a source electrode and a drain electrode electrically connected to the semiconductor layer.

* * * * *